United States Patent
Yeong et al.

(10) Patent No.: US 11,088,154 B1
(45) Date of Patent: Aug. 10, 2021

(54) FERROELECTRIC DEVICE AND METHODS OF FABRICATION THEREOF

(71) Applicant: Taiwan Semiconductor Manufacturing Company, Ltd., Hsinchu (TW)

(72) Inventors: Sai-Hooi Yeong, Zhubei (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/787,390

(22) Filed: Feb. 11, 2020

(51) Int. Cl.
*H01L 49/02* (2006.01)
*H01L 27/11507* (2017.01)
*H01L 29/66* (2006.01)
*H01L 29/78* (2006.01)

(52) U.S. Cl.
CPC ........ *H01L 27/11507* (2013.01); *H01L 28/60* (2013.01); *H01L 28/91* (2013.01); *H01L 28/92* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | | |
|---|---|---|---|---|
| 2003/0030079 A1* | 2/2003 | Hsu | ......................... | H01L 28/55 257/240 |
| 2005/0161723 A1* | 7/2005 | Higuchi | .................. | H01L 28/55 257/301 |
| 2010/0079924 A1* | 4/2010 | Keating | .................... | H01G 4/33 361/305 |
| 2011/0272664 A1* | 11/2011 | Tada | ........................ | H01L 45/04 257/4 |
| 2018/0076334 A1* | 3/2018 | Ando | ................. | H01L 29/40111 |

* cited by examiner

*Primary Examiner* — Grant S Withers
(74) *Attorney, Agent, or Firm* — Slater Matsil, LLP

(57) ABSTRACT

A semiconductor device includes a first dielectric layer, a first conductive feature in the first dielectric layer, a second dielectric layer over the first dielectric layer, an ferroelectric random-access memory (FeRAM) cell in the second dielectric layer, a third dielectric layer over the second dielectric layer, and a second conductive feature in the third dielectric layer, the second conductive feature being electrically coupled to the top electrode. The FeRAM cell includes a bottom electrode contacting the first conductive feature, a ferroelectric material layer completely covering an upper surface of the bottom electrode, and a top electrode on the ferroelectric material layer.

20 Claims, 22 Drawing Sheets

FERROELECTRIC DEVICE AND METHODS OF FABRICATION THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to increase the density of electronic components (e.g., transistors, diodes, resistors, capacitors, etc.) in integrated circuits (ICs) by innovations in semiconductor technology such as, progressive reductions in minimum feature size, three-dimensional (3D) transistor structures (e.g., the fin field-effect transistor (FinFET)), increasing the number of interconnect levels, and non-semiconductor memory, such as ferroelectric random access memory (RAM) or FeRAM, and magneto-resistive RAM or MRAM, within the interconnect levels stacked above the semiconductor substrate. The basic storage element of a FeRAM is the MTJ (magnetic tunnel junction). A high component density enables the System-on-Chip (SoC) concept wherein multiple functional blocks, such as, central processing unit (CPU), cache memory (e.g., static RAM (SRAM)), analog/RF functions, and nonvolatile memory (e.g., Flash, FeRAM, and MRAM) are integrated on a single integrated circuit, often referred to as a chip. Integrating such a diversity of functions on one chip often presents new challenges in forming and integrating a concomitantly large variety of electronic components and transistor structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 20 illustrate cross-sectional and plan views of a device including a FeRAM cell at various intermediate stages of fabrication, in accordance with some embodiments.

DETAILED DESCRIPTION

Figure 1:
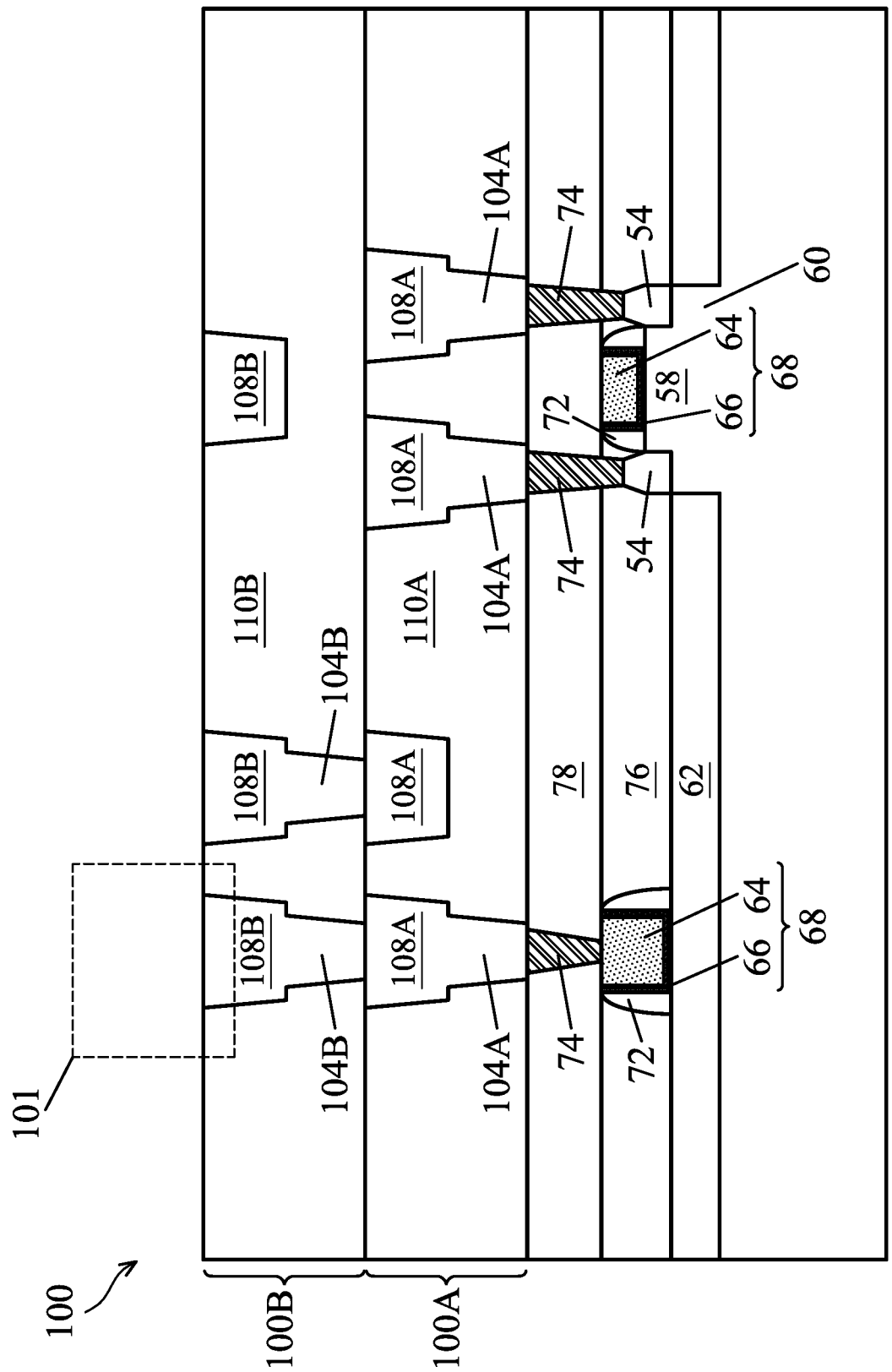
FIG. 1 illustrates a cross-sectional view of a semiconductor substrate and multilevel interconnect structures of an integrated circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure includes, for example, FeRAM one-transistor one-capacitor (1T1C) bitcells and methods of forming thereof. Multiple robust integration structures or schemes are disclosed to prevent formation of electrical shunting paths through a FeRAM cell. Use of a cross-sectional U-shape via fill process may reduce the number of fabrication steps and process cost in comparison with a flat metal-ferroelectric-metal sandwich structure, and the disclosed methods and structures herein can avoid the formation of electrical shunting paths, such as from a bottom electrode of the FeRAM cell to a conductive element located above the top electrode if the bottom electrode makes physical contact with the conductive element at a top surface of the U-shape of the bottom electrode. The prevention of shunting paths may stop current leakage out of the FeRAM cell, thereby producing robust FeRAM cell performance by allowing the FeRAM cell to hold its stored charge better. While the present disclosure discusses aspects of methods of forming a FeRAM cell in the context of a back end of line (BEOL) process or middle end of line (MEOL) process performed after, e.g., a FinFET formation process, other embodiments may utilize aspects of this disclosure with other semiconductor fabrication processes.

FIG. 1 illustrates a cross-sectional view of a semiconductor structure 100 comprising a semiconductor substrate 50 in which various electronic devices may be formed, and a portion of a multilevel interconnect system (e.g., layers 100A and 100B) formed over the substrate 50, in accordance with some embodiments. Generally, as will be discussed in greater detail below, FIG. 1 illustrates a FinFET device 60 formed on a substrate 50, with multiple interconnection layers formed thereover.

Generally, the substrate 50 illustrated in FIG. 1 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The FinFET device 60 illustrated in FIG. 1 is a three-dimensional MOSFET structure formed in fin-like strips of semiconductor protrusions 58 referred to as fins. The cross-section shown in FIG. 1 is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 1 illustrates a single fin 58, although the substrate 50 may comprise any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1 is a high-k metal gate (HKMG) gate structure that may be formed using a gate-last process flow. In a gate last process flow a sacrificial dummy gate structure (not shown) is formed after forming the STI regions 62. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 62. As described in greater detail below, the dummy gate structure may be replaced by the HKMG gate structure 68 as illustrated in FIG. 1. The HKMG gate structure 68 illustrated in the right side in FIG. 1 (seen on the top of fin 58) is an example of an active HKMG gate structure which extends, e.g., along sidewalls of and over a the portion of fin 58 protruding above the STI 62, and the HKMG gate structure 68 in the left side in FIG. 1 is an example gate structure extending over the STI region 62, such as between adjacent fins. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 60, illustrated in FIG. 1, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin (as illustrated in the right side of FIG. 1) or the surface of the STI dielectric (as illustrated in the left side of FIG. 1).

Source and drain regions 54 are semiconductor regions in direct contact with the semiconductor fin 58. In some embodiments, the source and drain regions 54 may comprise heavily-doped regions and relatively lightly-doped drain extensions, or LDD regions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily-doped source and drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions 54 either in situ during SEG, or by an ion implantation process performed after the SEG, or by a combination thereof.

A first interlayer dielectric (ILD) 76 (seen in FIG. 1) is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD 76. The HKMG gate structures 68, illustrated in FIG. 1, may then be formed by first removing the dummy gate structures using one or more etching techniques, thereby creating recesses between respective spacers 72.

Next, a replacement gate dielectric layer 66 comprising one more dielectrics, followed by a replacement conductive gate layer 64 comprising one or more conductive materials, are deposited to completely fill the recesses. The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like. Excess portions of the gate structure layers 64 and 66 may be removed from over the top surface of first ILD 76 using, for example a CMP process. The resulting structure, as illustrated in FIG. 1, may be a substantially coplanar surface comprising an exposed top surface of first ILD 76, spacers 72, and remaining portions of the HKMG gate layers 66 and 64 inlaid between respective spacers 72.

A second ILD layer 78 may be deposited over the first ILD layer 76, as illustrated in FIG. 1. In some embodiments, the insulating materials to form the first ILD layer 76 and the second ILD layer 78 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 76 and the second ILD layer 78 may be deposited using any suitable method, such as CVD, physical vapor deposition (PVD), ALD, PEALD, PECVD, SACVD, FCVD, spin-on, and/or the like, or a combination thereof.

As illustrated in FIG. 1, electrodes of electronic devices formed in the substrate 50 may be electrically connected to conductive features of a first interconnect level 100A using conductive connectors (e.g., contacts 74) formed through the intervening dielectric layers. In the example illustrated in FIG. 1, the contacts 74 make electrical connections to the source and drain regions 54 of FinFET 60. Contacts 74 to gate electrodes are typically formed over STI regions 62. A separate gate electrode 64 (shown in the left in FIG. 1) illustrates such contacts. The contacts may be formed using photolithography techniques. For example, a patterned mask may be formed over the second ILD 78 and used to etch openings that extend through the second ILD 78 to expose a portion of gate electrodes over STI regions 62, as well as etch openings over the fins 58 that extend further, through the first ILD 76 and the CESL (not shown) liner below first ILD 76 to expose portions of the source and drain regions 54. In some embodiments, an anisotropic dry etch process may be used wherein the etching is performed in two successive steps. The etchants used in the first step of the etch process have a higher etch rate for the materials of the first and second ILD layers 76 and 78 relative to the etch rate for the materials used in the gate electrodes 64 and the CESL, which may be lining the top surface of the heavily-doped regions of the source and drain regions 54. Once the first step of the etch process exposes the CESL, the second step of the etch process may be performed wherein the etchants may be switched to selectively remove the CESL.

In some embodiments, a conductive liner may be formed in the openings in the first ILD layer 76 and the second ILD layer 78. Subsequently, the openings are filled with a conductive fill material. The liner comprises barrier metals used to reduce out-diffusion of conductive materials from the contacts 74 into the surrounding dielectric materials. In some embodiments, the liner may comprise two barrier metal layers. The first barrier metal layer comes in contact with the semiconductor material in the source and drain regions 54 and may be subsequently chemically reacted with the heavily-doped semiconductor in the source and drain regions 54 to form a low resistance ohmic contact, after which the unreacted metal may be removed. For example, if the heavily-doped semiconductor in the source and drain regions 54 is silicon or silicon-germanium alloy semiconductor, then the first barrier metal layer may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the second ILD 78. The resulting conductive plugs extend into the first and second ILD layers 76 and 78 and constitute contacts 74 making physical and electrical connections to the electrodes of electronic devices, such as the tri-gate FinFET 60 illustrated in FIG. 1. In this example, contacts to electrodes over STI 62 and to electrodes over fins 58 are formed simultaneously using the same processing steps. However, in other embodiments these two types of contacts may be formed separately.

As illustrated in FIG. 1, multiple interconnect levels may be formed, stacked vertically above the contact plugs 74 formed in the first and second ILD layers 76 and 78, in accordance with a back end of line (BEOL) scheme adopted for the integrated circuit design. In the BEOL scheme illustrated in FIG. 1, various interconnect levels have similar features. However, it is understood that other embodiments may utilize alternate integration schemes wherein the various interconnect levels may use different features. For example, the contacts 74, which are shown as vertical connectors, may be extended to form conductive lines which transport current laterally.

In this disclosure, the second interconnect level comprises conductive vias and lines embedded in an intermetal dielectric (IMD). In addition to providing insulation between various conductive elements, an IMD may include one or more dielectric etch stop layers to control the etching processes that form openings in the IMD. Generally, vias conduct current vertically and are used to electrically connect two conductive features located at vertically adjacent levels, whereas lines conduct current laterally and are used to distribute electrical signals and power within one level. In the BEOL scheme illustrated in FIG. 1, conductive vias 104A connect contacts 74 to conductive lines 108A and, at subsequent levels, vias connect lower lines to upper lines (e.g., a pair of lines 108A and 108B can be connected by via 104B). Other embodiments may adopt a different scheme. For example, vias 104A may be omitted from the second level and the contacts 74 may be configured to be directly connected to lines 108A.

Still referring to FIG. 1, the first interconnect level 100A may be formed using, for example, a dual damascene process flow. First, a dielectric stack used to form IMD 110A may be deposited using one or more layers of the dielectric materials listed in the description of the first and second ILD layers 76 and 78. In some embodiments, IMD 110A includes an etch stop layer (not shown) positioned at the bottom of the dielectric stack. The etch stop layer comprises one or more insulator layers (e.g., SiN, SiC, SiCN, SiCO, CN, combinations thereof, or the like) having an etch rate different than an etch rate of an overlying material. The techniques used to deposit the dielectric stack for IMD may be the same as those used in forming the first and second ILD layers 76 and 78.

Appropriate photolithography and etching techniques (e.g., anisotropic RIE employing fluorocarbon chemistry) may be used to pattern the IMD 110A to form openings for vias and lines. The openings for vias may be vertical holes extending through IMD 110A to expose a top conductive surface of contacts 74, and openings for lines may be longitudinal trenches formed in an upper portion of the IMD 110A. In some embodiments, the method used to pattern holes and trenches in IMD 110A utilizes a via-first scheme, wherein a first photolithography and etch process form holes for vias, and a second photolithography and etch process form trenches for lines. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of IMD 110A and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Several conductive materials may be deposited to fill the holes and trenches forming the conductive features 104A and 108A of the first interconnect level 100A. The openings may be first lined with a conductive diffusion barrier material and then completely filled with a conductive fill material deposited over the conductive diffusion barrier liner. In some embodiments, a thin conductive seed layer may be deposited over the conductive diffusion barrier liner to help initiate an electrochemical plating (ECP) deposition step that completely fills the openings with a conductive fill material.

The diffusion barrier conductive liner in the vias 104A and lines 108A comprises one or more layers of TaN, Ta, TiN, Ti, Co, or the like, or combinations thereof. The conductive fill layer in 104A and 108A may comprise metals such as Cu, Al, W, Co, Ru, or the like, or combinations thereof, or multi-layers thereof. The conductive materials used in forming the conductive features 104A and 108A may be deposited by any suitable method, for example, CVD, PECVD, PVD, ALD, PEALD, ECP, electroless plating and the like. In some embodiments, the conductive seed layer may be of the same conductive material as the conductive fill layer and deposited using a suitable deposition technique (e.g., CVD, PECVD, ALD, PEALD, or PVD, or the like).

Any excess conductive material over the IMD 110A outside of the openings may be removed by a planarizing process (e.g., CMP) thereby forming a top surface comprising dielectric regions of IMD 110A that are substantially coplanar with conductive regions of conductive lines 108A. The planarization step embeds the conductive vias 104A and conductive lines 108A into IMD 110A, as illustrated in FIG. 1.

The interconnect level positioned vertically above the first interconnect level 100A in FIG. 1, is the second interconnect level 100B. In some embodiments, the structures of the various interconnect levels (e.g., the first interconnect level 100A and the second interconnect level 100B) may be similar. In the example illustrated in FIG. 1, the second interconnect level 100B comprises conductive vias 104B and conductive lines 108B embedded in an insulating film IMD 110B having a planar top surface. The materials and processing techniques described above in the context of the first interconnect level 100A may be used to form the second interconnect level 100B and subsequent interconnect levels.

Although an example electronic device (FinFET 60) and example interconnect structures making connections to the electronic device are described, it is understood that one of ordinary skill in the art will appreciate that the above examples are provided for illustrative purposes only to further explain applications of the present embodiments, and are not meant to limit the present embodiments in any manner.

Figure 2:
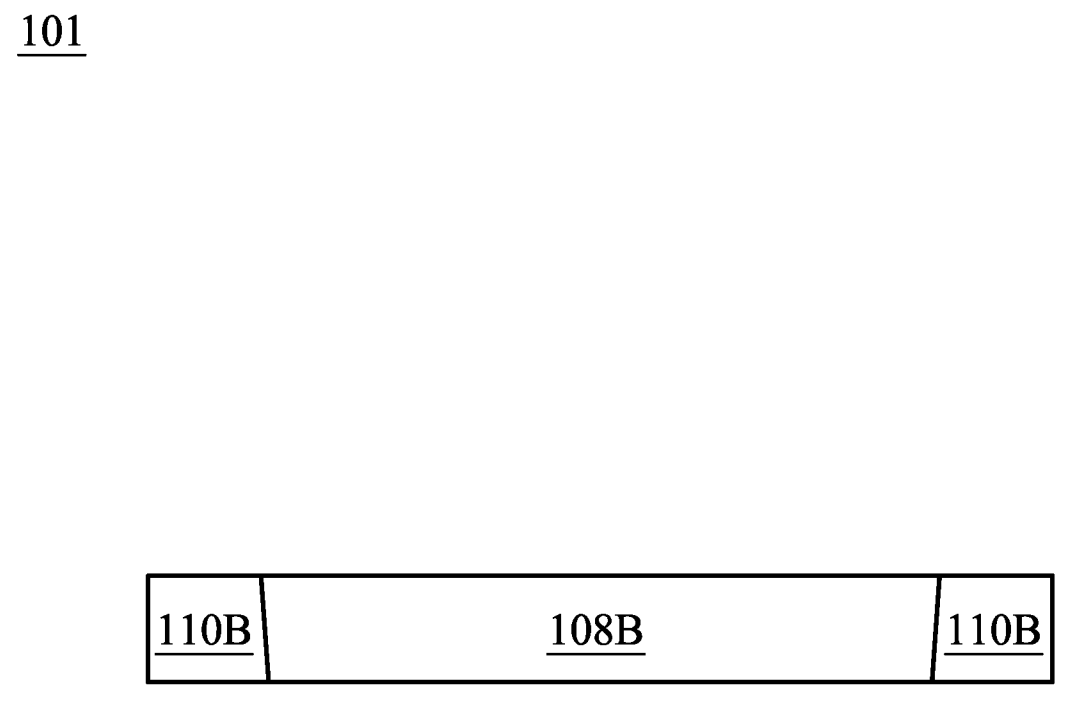

FIG. 2 illustrates a detailed view of region 101 of FIG. 1, showing a top portion of an interconnect level 100B at an initial stage of fabrication of the FeRAM array (with one FeRAM cell being shown). In FIG. 2, a conductive line 108B at the interconnect level 100B has been illustrated as the conductive element or conductive feature 108B to which a bottom electrode (BE) of an FeRAM cell will be electrically coupled at a subsequent processing step, in accordance with some embodiments. The conductive line 108B is shown for illustrative purposes only; it is understood that the BE and FeRAM cell may be formed on any conductive feature in any metallization layer suitable in a particular design. For example, the BE of the FeRAM cell could be formed on the conductive line 108A, the conductive via 104A, on a conductive element or conductive feature 108C on a higher interconnect level (not illustrated), or on another metal plug or conductive feature. In FIG. 2, the conductive feature 108B is shown embedded in an insulating film IMD 110B. The top dielectric surface of IMD 110B is shown to be substantially coplanar with the top conductive surface of conductive feature 108B, within process variations.

Figure 3:
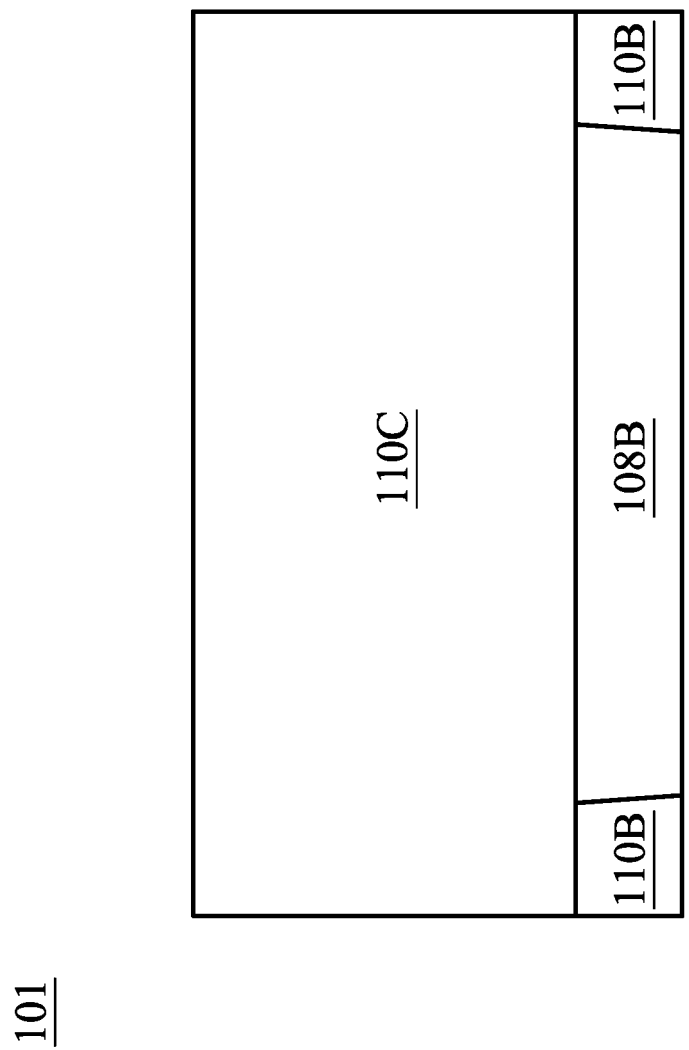

FIG. 3 illustrates an IMD 110C formed over the conductive feature 108B and the IMD 110B. The techniques used to deposit the dielectric stack for IMD 110C may be the same as those used in forming the first and second ILD layers 76 and 78, as well as the IMDs 110A and 110B.

Figure 4:
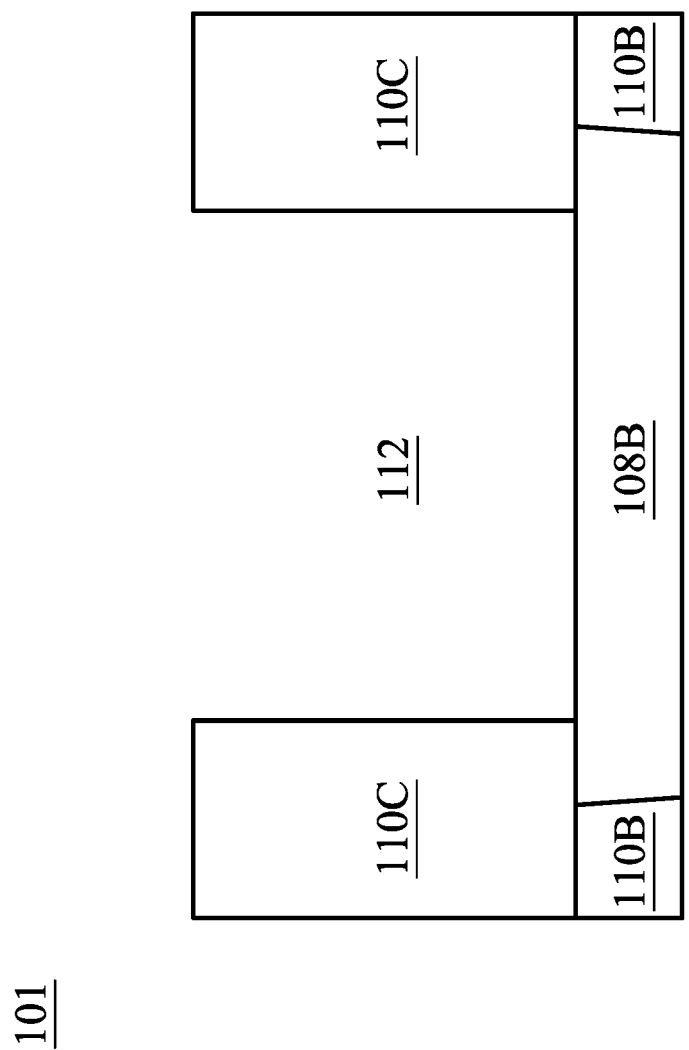

FIG. 4 illustrates an opening 112 formed through the IMD 110C to the top surface of the conductive feature 108B. Appropriate photolithography and etching techniques (e.g., anisotropic RIE employing fluorocarbon chemistry) may be used to pattern the IMD 110C to form the opening 112. In some embodiments, the opening 112 is a vertical hole extending through the IMD 110C to expose a top conductive surface of the conductive feature 108B. In a plan view, the opening 112 may comprise a round shape, such as a circular shape, or a rectangular shape, such as a square shape. The etching techniques may utilize multiple steps. For example, a first main etch step may remove a portion of the dielectric material of IMD 110C and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Figure 5:
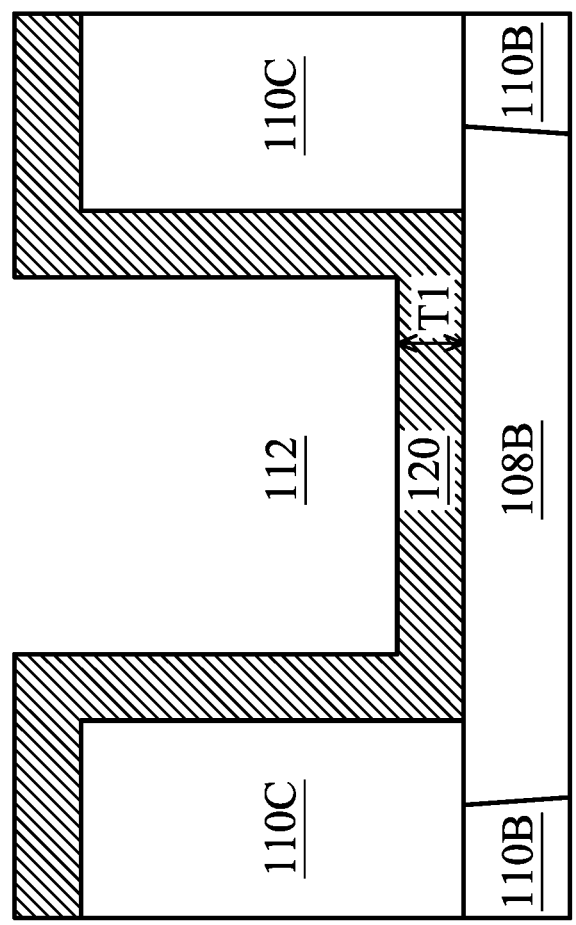

FIG. 5 illustrates a conductive material 120 formed over the exposed surfaces of the IMD 110C and the conductive feature 108B. As will be discussed in greater detail below, the conductive material 120 will be subsequently patterned and will form a bottom electrode of the FeRAM capacitor. The conductive material 120 can comprise TiN, TaN, W, Cu, or the like, or a combination thereof. The conductive material 120 may be deposited as a conformal layer using any suitable technique, such as CVD, ALD, PECVD, PEALD, or PVD, or the like, or a combination thereof. In some embodiments, the conductive material 120 may have a thickness T1 of about 5 nm or greater. The thickness T1 being in the range of about 5 nm or greater may provide proper resistance to enable good conduction and a film with full coverage of the underlying feature which may act as a high quality template for subsequent film growth. The thickness T1 being less than about 5 nm may result in high contact resistance ($R_c$) or in-balance ferroelectric switching during the capacitor operation.

Figure 6:
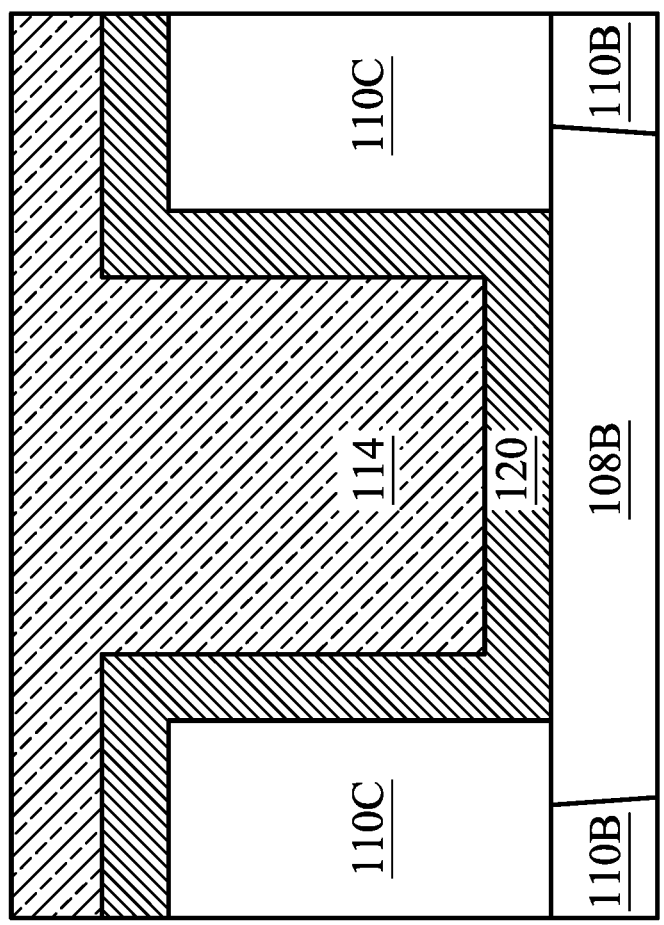

Referring to FIG. 6, a bottom mask 114 is formed over the conductive material 120, filling the opening 112. As will be discussed in greater detail below, the bottom mask 114 will be used to recess the conductive material 120 prior to forming a ferroelectric material and a top electrode. The recessing of the conductive material 120 reduces the top height of the conductive material 120, which may allow the ferroelectric material to cover the conductive material 120 and may reduce or prevent the formation of shunting paths from the conductive material 120 to another conductive feature formed above the conductive material 120, as discussed in greater detail with respect to FIG. 12 below. In some embodiments, the bottom mask 114 comprises one or more layers of bottom anti-reflective coatings (BARCs) comprising mixtures of polymers, e.g. such as propylene glycol, methyl ether (PGME), propylene glycol methyl ether acetate (PGMEA), ethyl lactate (EL), the like, or a combination thereof. The bottom mask 114 may be formed by processes such as spin coating or CVD.

Figure 7:
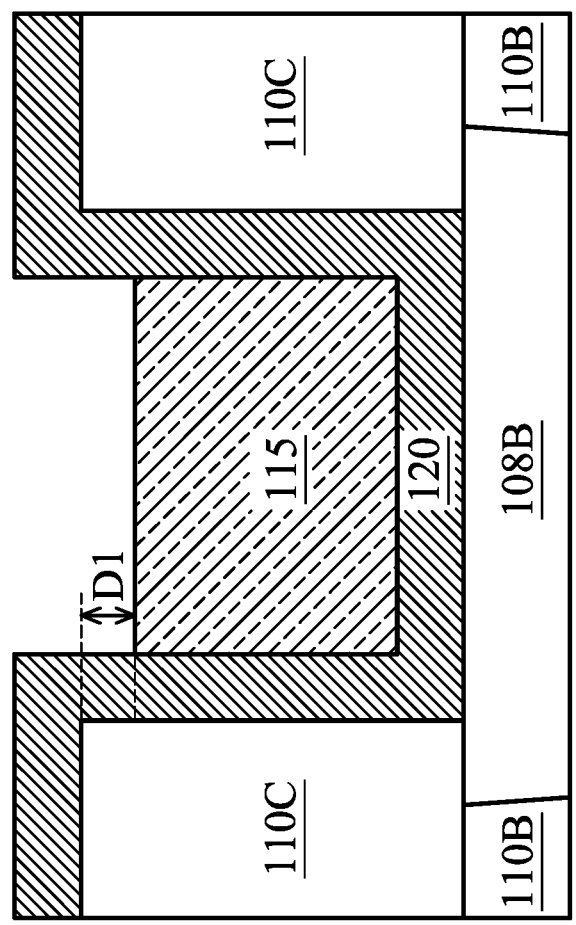

FIG. 7 illustrates recessing of a top portion of the bottom mask 114. The recess of the top portion of the bottom mask 114 exposes a top surface and upper portions of sidewalls of the conductive material 120. The remaining portion of the bottom mask 114 forms a remaining bottom mask 115. The recessing of the top portion of the bottom mask 114 may comprise an etch back such as a dry or wet etching. In some embodiments, the etch back comprises a dry etch performed with a plasma comprising $CF^{3*}$, $CF^{2*}$, $CF^*$, $C^*$, $F^*$ ions, the like, or a combination thereof, with a power measured at the power source in a range of about 50 W to about 50 W.

After the removal of the top portion of the bottom mask 114, the top surface of the remaining bottom mask 115 may be recessed by a depth D1 in a range of about 5 nm to about 20 nm below the upper surface of the IMD 110C. The depth D1 may be chosen as the local thickness of a ferroelectric material layer formed later over top portions of a bottom electrode, as described below with respect to FIG. 9A. The depth D1 being in the range of about 5 nm to about 20 nm may reduce or prevent shunting paths from being formed between a bottom electrode and an upper conductive feature formed later, as described below with respect to FIG. 12. This may reduce or stop current leakage out of the FeRAM cell formed later, as described below with respect to FIG. 10. A depth D1 of less than 5 nm may lead to a layer of ferroelectric insulating material too thin to stop leakage current from the bottom electrode to the upper conductive feature. A depth D1 of more than 20 nm may result in incomplete ferroelectric switching or a larger applied E-field which may lead to a higher risk of breakdown.

Figure 8:
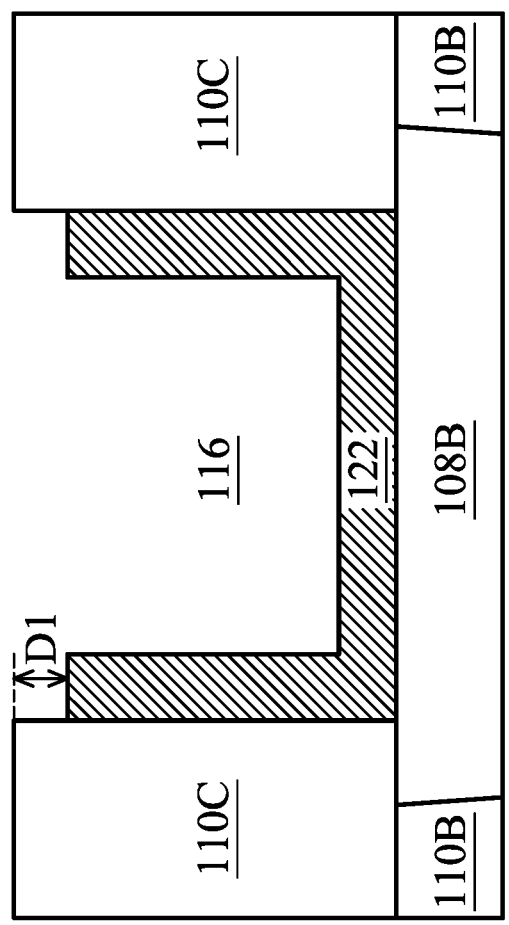

FIG. 8 illustrates a removal of a portion of the conductive material 120 over the IMD 110C, thereby forming a lower metal layer or bottom electrode (BE) 122. The removal of the portion of the conductive material 120 exposes a top surface of the IMD 110C. The remaining portion of the conductive material 120 is protected by the remaining bottom mask 115 (see FIG. 7) during the removal. The removal of the portion of the conductive material 120 may comprise an etch back such as a dry or wet etching selective to the conductive material 120. In some embodiments, the etch back comprises a dry etch performed with a plasma comprising $CF^{3*}$, $CF^{2*}$, $CF^*$, $C^*$, and $F^*$ ions, a CO plasma with the addition of nitrogen, argon, helium and other gases, a combination thereof, or the like, with a power measured at the power source in a range of about 50 W to about 500 W. The BE 122 comprises a U-shape in a cross sectional view, extending along an upper surface of the conductive feature 108B and along sidewalls of the IMD 110C, as shown in FIG. 8. The upper surface of the BE 122 may be below the upper surface of the IMD 110C by the depth D1.

FIG. 8 further illustrates a removal of the remaining bottom mask 115, which may be performed by a removal process selective to the material of the remaining bottom mask 115. The removal process is performed after forming the BE 122 and may comprise a dry or wet etching. In some embodiments, the removal process comprises a dry etch performed with a plasma comprising $CF^{3*}$, $CF^{2*}$, $CF^*$, $C^*$, and $F^*$ ions, a CO-plasma with the addition of nitrogen, argon, helium and other gases, the like, or a combination thereof, with a power measured at the power source in a range of about 50 W to about 500 W.

Figure 9A:
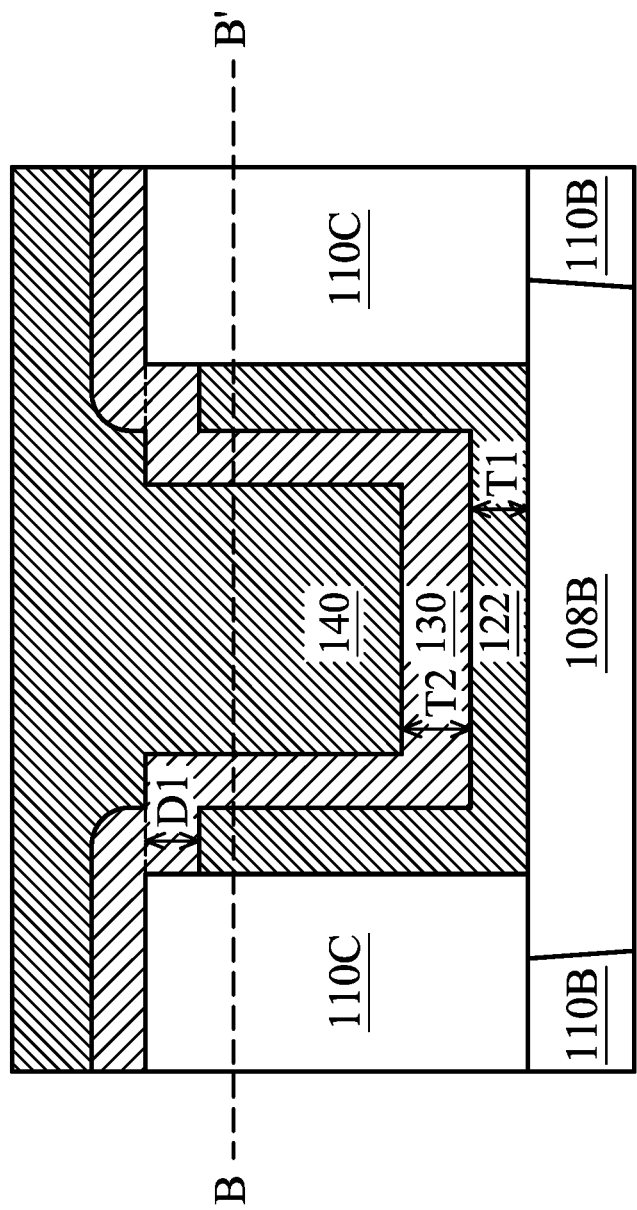

FIG. 9A illustrates the formation of the ferroelectric material layer or ferroelectric insulating material 130 over the BE 122 and the IMD 110C. In some embodiments, the ferroelectric insulating material 130 may physically contact a top surface and/or sidewall of the IMD 110C. The ferroelectric insulating material 130 may comprise a high-K Hf-based film such as, e.g., $HfO_2$, HfZrO, HfSiO, HfAlO, HfLaO, the like, or a combination thereof. The ferroelectric insulating material 130 may have a thickness T2 in a range of about 5 nm to about 20 nm. In some embodiments, the thickness T2 may be substantially similar as the depth D1. In some embodiments in which an atomic layer deposition (ALD) process is utilized to form the ferroelectric insulating material 130, the ALD process may be performed by utilizing a cyclic set of steps which may introduce a first precursor for use in a first self-limiting reaction, purge the first precursor, introduce a second precursor for use in a second self-limiting reaction, and purge the second precursor to complete a first cycle. Once the first cycle has been completed, the first cycle may be repeated for a second cycle, with each cycle depositing a monolayer of the desired material until a desired thickness is reached. For example, in an embodiment in which the ferroelectric insulating material 130 is hafnium oxide ($HfO_2$), a first precursor such as hafnium chloride ($HfCl_4$) may be introduced and then purged, and a second precursor comprising oxygen such as water ($H_2O$), de-ionized water (DI), ozone ($O_3$), or any other suitable oxygen containing molecule may be introduced as the second precursor to form a single monolayer of hafnium oxide ($HfO_2$). The ALD process described above, may be repeated any number of times to form a high-k dielectric layer (e.g., an amorphous $HfO_2$ layer) having a desired thickness.

In some embodiments in which the ferroelectric insulating material 130 is doped, a dopant-source layer (not shown) is deposited over the ferroelectric insulating material 130 (e.g., a $HfO_2$ layer) using, for example, CVD, ALD, plasma-enhanced ALD (PEALD), or the like, or a combination thereof. The dopant-source layers may comprise a material such as $SiO_x$, $Al_yO_x$, $La_yO_x$, or $Zr_yO_x$ for a source of the dopants Si, Al, La, and Zr, respectively, as examples in a laminar or sandwiching manner. A post-deposition anneal (PDA) is performed after the deposition of laminar layers. In some embodiments, the PDA is performed in a $N_2$ ambient or a dilute-oxygen ambient. The PDA may be a rapid thermal anneal (RTA) or a spike anneal. In some embodiments, instead of PDA, a post-metal deposition anneal (PMA) is performed after the deposition of metal on top of the ferroelectric insulating material 130. The PMA is performed in a $N_2$ ambient or a dilute-oxygen ambient. The PDA may be a rapid thermal anneal (RTA) or a spike anneal.

FIG. 9A further illustrates the formation of a conductive material 140 over the ferroelectric insulating material 130. The conductive material 140 may be formed by the same processes and may comprise the same materials as described for the conductive material 120 above with respect to FIG. 5.

Figure 9C:
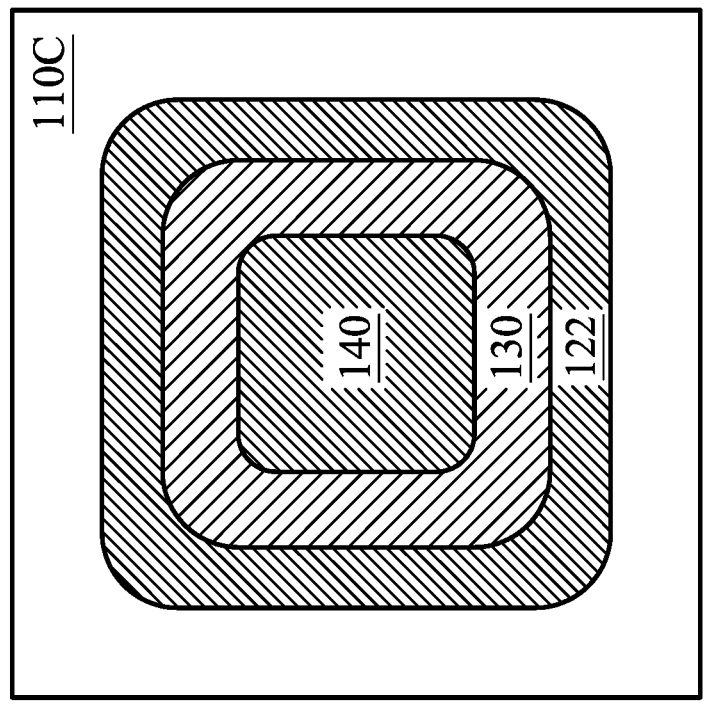
Figure 9B:
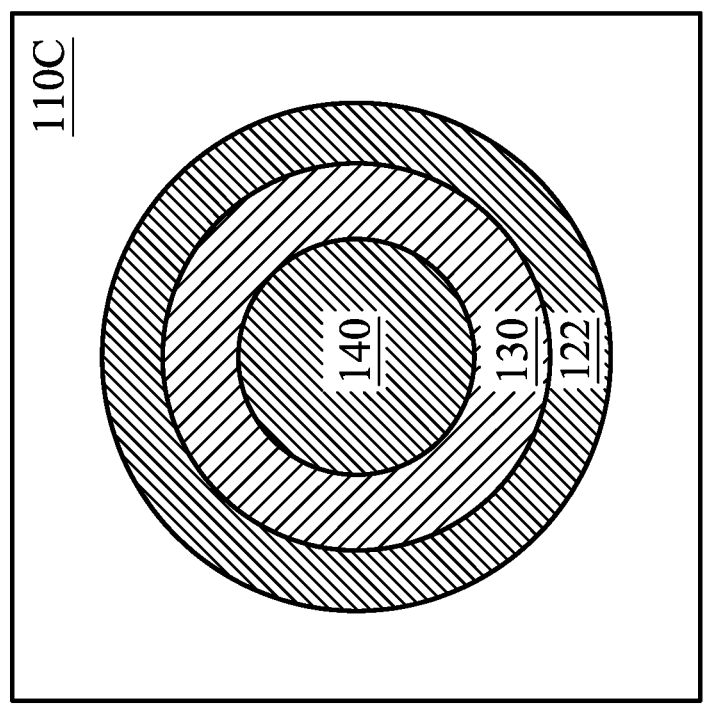

FIGS. 9B and 9C illustrate cross-sectional plan views of FIG. 9A along the cross-section B-B' as illustrated in FIG. 9A. In the plan views of FIGS. 9B and 9C, the conductive material 140 is surrounded by the ferroelectric insulating material 130, which is itself surrounded by the BE 122. In some embodiments as illustrated in FIG. 9B, the BE 122, the ferroelectric insulating material 130, and the conductive material 140 comprise roughly circular shapes. In some embodiments, the BE 122, the ferroelectric insulating material 130, and the conductive material 140 may comprise more oblong shapes. In some other embodiments as illustrated in FIG. 8C, the ferroelectric insulating material 130 and the conductive material 140 comprise roughly square shapes with rounded corners. In some embodiments, the BE 122, the ferroelectric insulating material 130, and the conductive material 140 may comprise more rectangular shapes.

Figure 10:
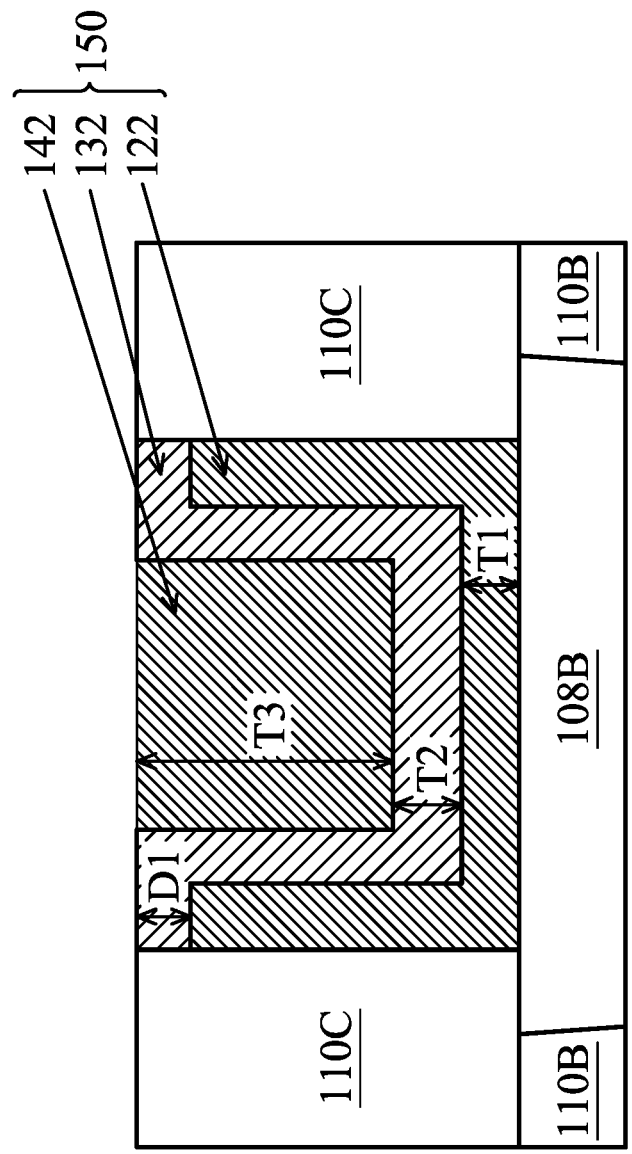

FIG. 10 illustrates removal of portions of the ferroelectric insulating material 130 and the conductive material 140 overlying the top surface of the IMD 110C, thereby forming a FeRAM cell 150 in accordance with some embodiments. The remaining portion of the ferroelectric insulating material 130 forms a ferroelectric insulating layer or insulating element 132, and the remaining portion of the conductive material 140 forms an upper metal layer or top electrode (TE) 142. The removal may expose a top surface of the IMD 110C. The removal of the top portions of the ferroelectric insulating material 130 and the conductive material 140 may be performed by a planarization, such as e.g. a chemical mechanical polish (CMP). The FeRAM cell 150 comprises the BE 122, the ferroelectric insulating layer 132 on the BE 122, and the top electrode 142 on the ferroelectric insulating layer 132. The ferroelectric layer or ferroelectric insulating layer 132 completely covers the BE 122. The top surface of the TE 142 is level with a top surface of the ferroelectric insulating layer 132. The TE 142 may have a thickness T3 in a range of about 50 nm to about 200 nm. The thickness T3 may be determined in order to achieve a specific property, such as e.g. an RC delay in the larger BEOL or MEOL circuit.

Figure 11:
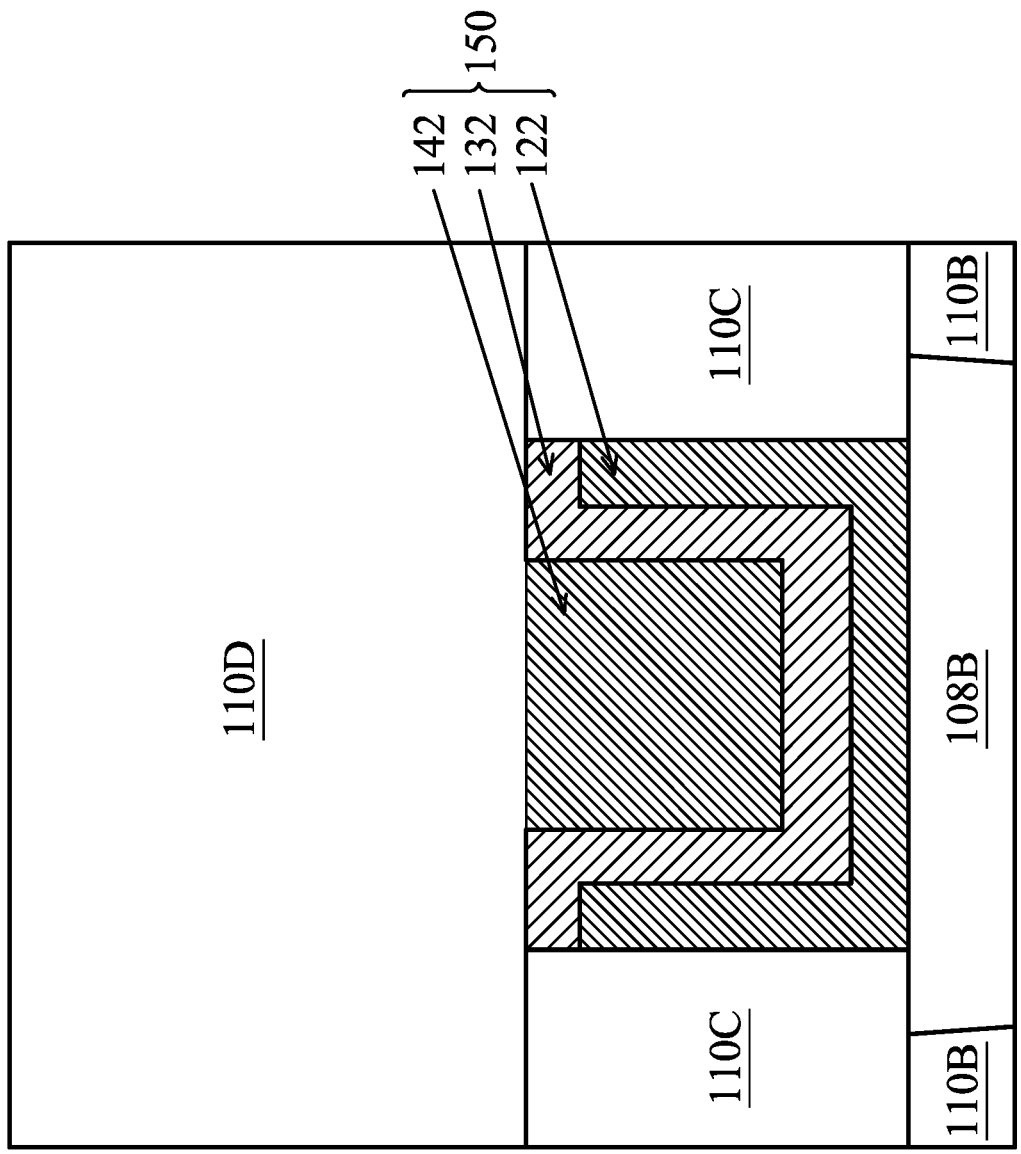

FIG. 11 illustrates an IMD 110D formed over the FeRAM cell 150 and the IMD 110C. The techniques used to deposit the dielectric stack for IMD 110D may be the same as those used in forming the first and second ILD layers 76 and 78, as well as the IMDs 110A, 110B, and 110C.

Figure 12:
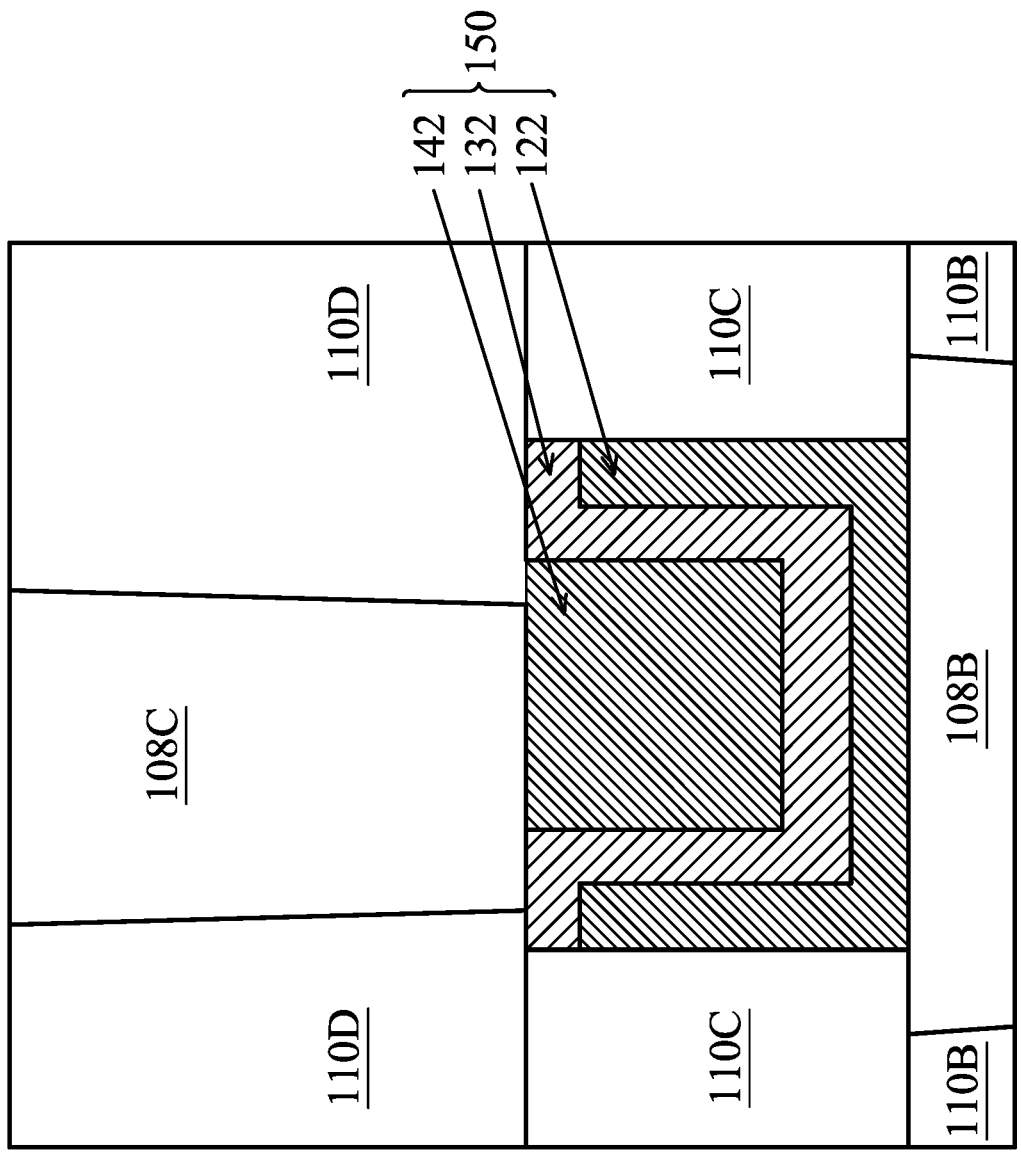

FIG. 12 illustrates a conductive element or conductive feature 108C formed through the IMD 110D to physically contact the top surface of the FeRAM cell 150. The techniques used to form the conductive feature 108C may be the same as those used in forming the conductive lines 108A and 108B, as described above with respect to FIG. 1. In some embodiments, the conductive feature 108C extends beyond the lateral boundaries of the TE 142. For example, FIG. 12 illustrates an embodiment in which the conductive feature 108C is not centered directly over the TE 142, such as may occur due to a misalignment. The recessing of the BE 122 and the formation of the ferroelectric insulating layer 132 completely covering an upper surface of the BE 122 provides an insulating layer (e.g., the ferroelectric insulating layer 132) between the BE 122 and an overlying conductive feature, such as the conductive feature 108C. Such an arrangement reduces or prevents the electrical shorting or shunting paths between the BE 122 and the conductive feature 108C. This may reduce or prevent current leakage out of the FeRAM cell 150, allowing the FeRAM cell to hold stored charge better and producing more robust FeRAM cell performance.

Figure 13:
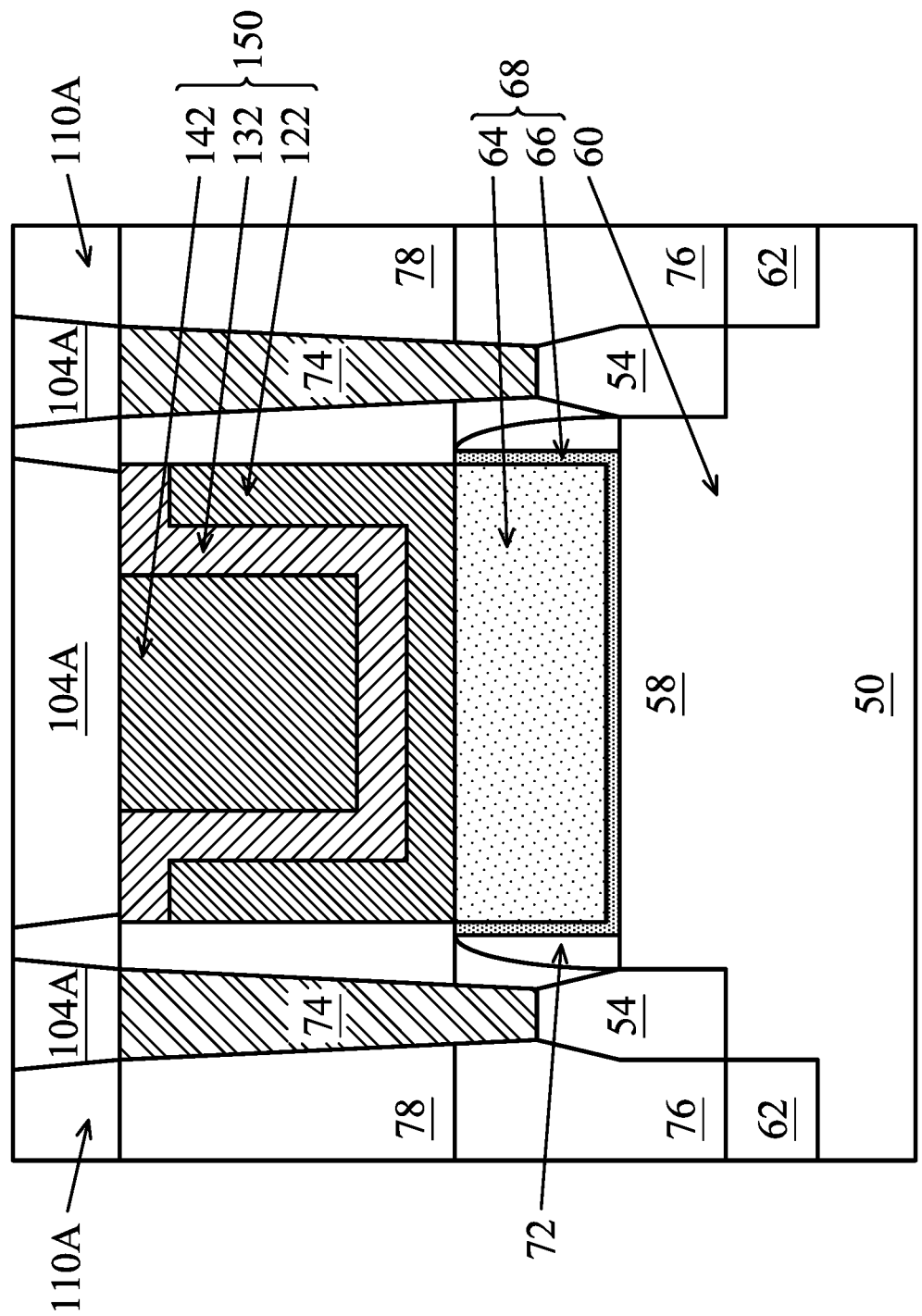

FIG. 13 illustrates an embodiment in which the FeRAM cell 150 is formed directly on the gate electrode 64 in a MEOL process. The method for forming the FeRAM cell 150 on the gate electrode 64 in a MEOL process may be substantially similar as the method for forming the FeRAM cell 150 on the conductive feature 108B in a BEOL process as illustrated above in FIGS. 2 through 12, with the gate electrode 64 substituting for the conductive feature 108B, the second ILD layer 78 substituting for the IMD 110C, the IMD 110A substituting for the IMD 110D, and the conductive via 104A substituting for the conductive feature 108C. Contacts 74 to the source and drain regions 54 may be formed before or after forming the FeRAM cell 150, and before forming the IMD 110A. FIG. 13 illustrates the contacts 74 in the same cross-sectional view as the FeRAM cell 150 for illustrative purposes, and in some embodiments the contacts 74 may be offset from the FeRAM cell 150. For example, in some embodiments the FeRAM cell 150 may be positioned over the STI regions 62, similar to that shown in FIG. 1. Integrating the FeRAM cell 150 in a MEOL scheme such that the FeRAM cell 150 directly contacts the gate electrode 64 is advantageous because increased proximity of the FeRAM cell 150 to the FinFET 60 may provide the benefit of a better RC delay.

FIGS. 14A through 20 illustrate various intermediate steps in formation of an FeRAM cell 150' in accordance with some embodiments. In these embodiments, the FeRAM cell 150' is formed with a thicker ferroelectric insulating layer 132' than the ferroelectric insulating layer 132 of the FeRAM cell 150 as illustrated in FIG. 12.

The processes depicted in FIGS. 14A through 20 assume a process similar to that discussed above with reference to FIGS. 1 through 5 has been performed. Accordingly, FIG. 14A follows from FIG. 5 and illustrates the formation of a ferroelectric material or ferroelectric insulating material 130' over the BE 122 conductive material 120 and the IMD 110C. The ferroelectric insulating material 130' may comprise a high-K Hf-based film such as, e.g., $HfO_2$, HfZrO, HfSiO, HfAlO, HfLaO, the like, or a combination thereof. The ferroelectric insulating material 130' can be formed with a suitable method such as ALD or PEALD. The ferroelectric insulating material 130' may be doped with Si, Al, La, Ge, N, Gd, the like, or a combination thereof. The doping may be performed by an implantation process with implanted species of Si, Al, La, Ge, N, Gd, the like, or a combination thereof or by diffusion from a metal oxide such as $SiO_x$, $Al_yO_x$, $La_yO_x$, $Zr_yO_x$, the like, or a combination thereof, triggered by an anneal.

Figure 14A:
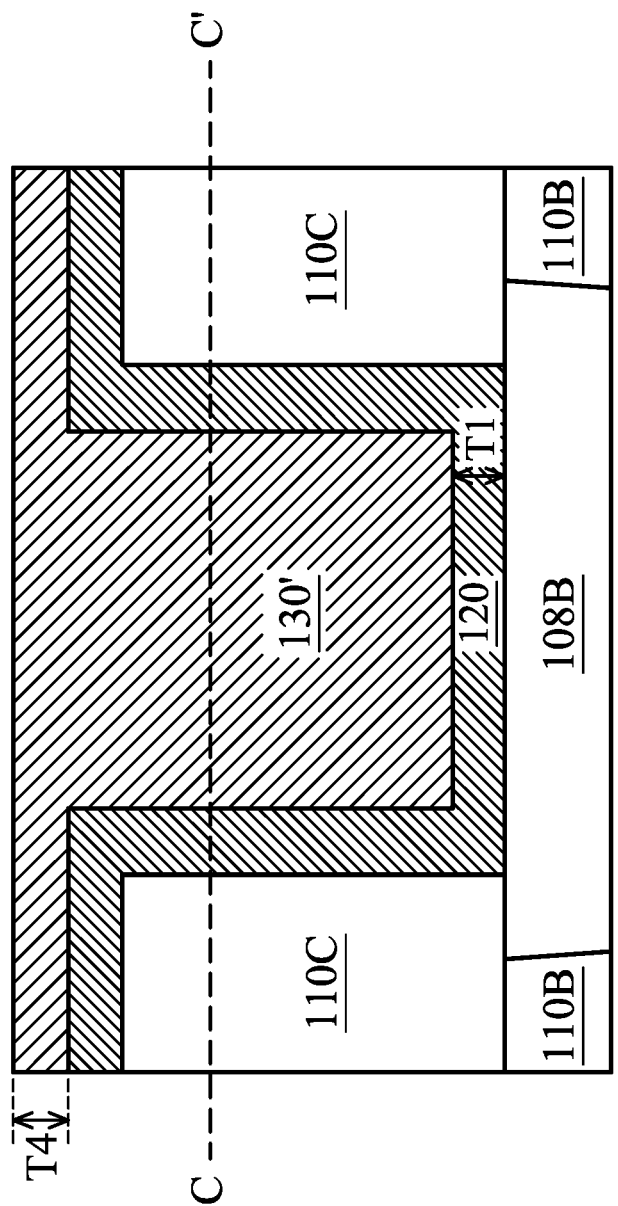
Figure 14C:
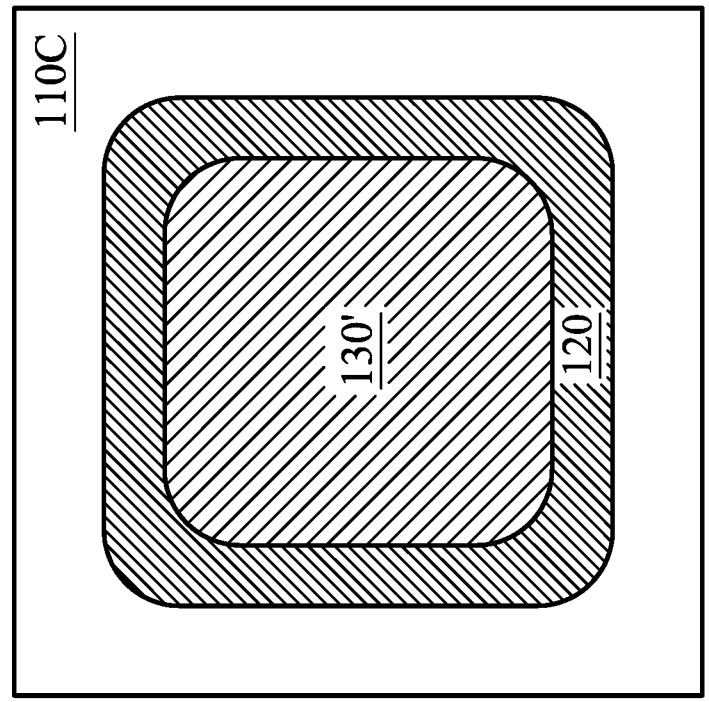
Figure 14B:
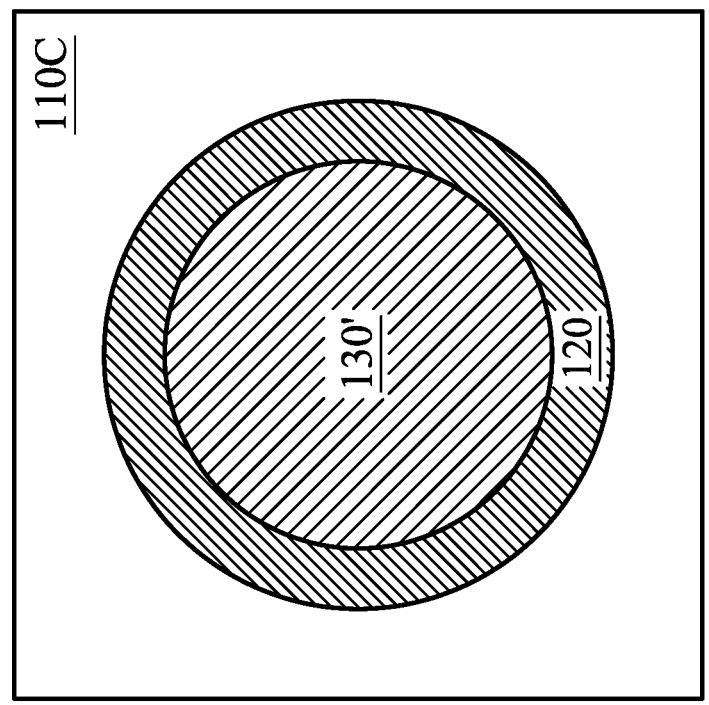

The ferroelectric insulating material 130' may be planarized by, e.g. a CMP process. After the planarization, a top portion of the ferroelectric insulating material 130' located above the IMD 110C may have a thickness T4 in a range of about 5 nm to about 20 nm. The thickness T4 being in the range of about 5 nm to about 20 may reduce or prevent shunting paths from being formed between the BE 122' and a conductive feature 108C formed later, as described below with respect to FIG. 19. This may reduce or stop current leakage out of the FeRAM cell 150' formed later, as described below with respect to FIG. 17. A thickness T4 of less than 5 nm may produce a layer of ferroelectric insulating material too thin to sufficiently stop leakage current from the BE 122' to the conductive feature 108C. A thickness T4 of more than 20 nm may result in incomplete ferroelectric switching or a larger applied E-field which may lead to a higher risk of breakdown. FIGS. 14B and 14C illustrate cross-sectional plan views of FIG. 14A along the cross-section C-C' as illustrated in FIG. 14A. In the plan views of FIGS. 14B and 14C, the ferroelectric insulating material 130' is surrounded by the conducting material 120. In some embodiments as illustrated in FIG. 14B, the ferroelectric insulating material 130' and the conductive material 120 comprise roughly circular shapes. In some embodiments, the ferroelectric insulating material 130' and the conductive material 120 may comprise more oblong shapes. In some other embodiments as illustrated in FIG. 14C, the ferroelectric insulating material 130' and the conductive material 120 comprise roughly square shapes with rounded corners. In some embodiments, the ferroelectric insulating material 130' and the conductive material 120 may comprise more rectangular shapes.

Figure 15:
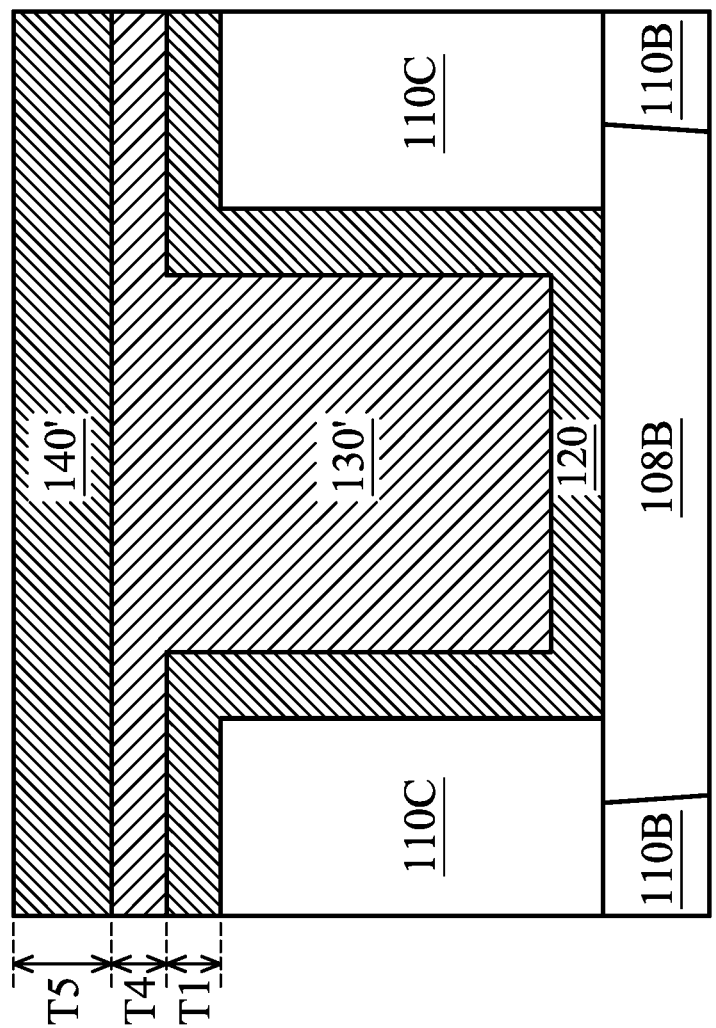

FIG. 15 illustrates the formation of a conductive material 140' over the ferroelectric insulating material 130'. The conductive material 140' may be formed by the same processes and may comprise the same materials as described for the conductive material 120 above with respect to FIG. 5. The conductive material 140' may have a thickness T5 in a range of about 50 nm to about 200 nm. The thickness T5 may be determined in order to achieve a specific property, such as e.g. an RC delay in the larger BEOL or MEOL circuit.

Figure 16:
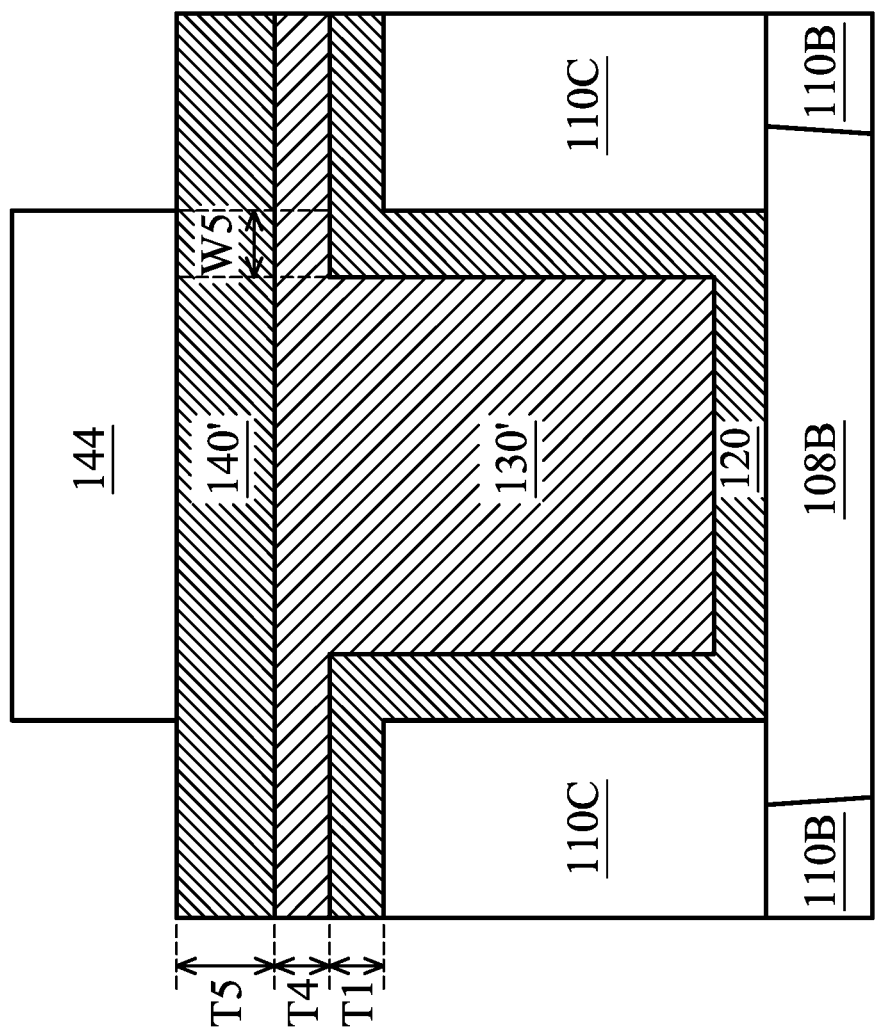

FIG. 16 illustrates the formation of a mask 144, such as a photoresist, a hardmask, or a combination thereof, over the conductive material 140'. As discussed in greater detail below, the mask 144 will be used to pattern the conductive material 140', the ferroelectric insulating material 130' and the conductive material 120. Thus, the mask 144 is patterned to define a desired size of the FeRAM 150' (see FIG. 17). In some embodiments, the mask 144 has an overhang distance D2 over an upper portion of the ferroelectric insulating material 130' past a lower sidewall of the ferroelectric insulating material in a range of about 5 nm to about 15 nm. The mask 144 can be formed by using a spin-on technique and can be patterned using acceptable photolithography techniques. The mask 144 protects the covered portions of the conductive material 140', the ferroelectric insulating material 130', and the conductive material 120 during a subsequent etching, as described below with respect to FIG. 17.

Figure 17:
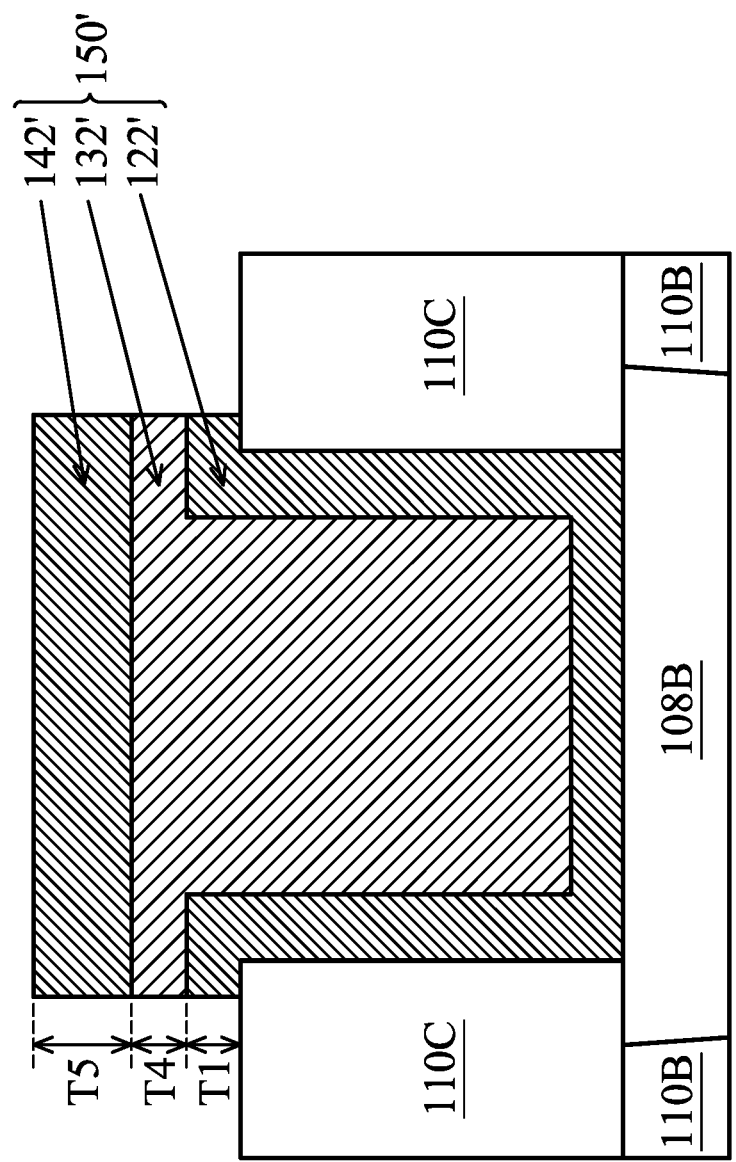

FIG. 17 illustrates the formation of a FeRAM cell 150'. Outer portions of the conductive material 140', the ferroelectric insulating material 130', and the conductive material 120, which are not covered by the mask 144, are removed. The remaining portion of the conductive material 120 forms a lower metal layer or bottom electrode (BE) 122', the remaining portion of the ferroelectric insulating material 130' forms a ferroelectric insulating layer or insulating element 132', and the remaining portion of the conductive material 140' forms an upper metal layer or top electrode (TE) 142'. The removal may expose a top surface of the IMD 110C. The removal of the outer portions of the conductive material 140', the ferroelectric insulating material 130', and the conductive material 120 may be performed by an etching, such as e.g. a dry or wet etching. In some embodiments, the etching comprises a dry etch performed with a plasma comprising $CF^{3*}$, $CF^{2*}$, $CF^*$, $C^*$, and $F^*$ ions, a CO-plasma with the addition of nitrogen, argon, helium and other gases, the like, or a combination thereof, with a power measured at the power source in a range of about 100 W to about 1000 W. After the removal of the outer portions of the conductive material 140', the ferroelectric insulating material 130', and the conductive material 120, the mask 144 is removed, such as e.g. by an ashing.

The FeRAM cell 150' comprises the BE 122', the ferroelectric insulating layer 132' on the BE 122', and the top electrode 142' on the ferroelectric insulating layer 132'. The ferroelectric insulating layer 132' completely covers an upper surface of the BE 122'. The bottom surface of the TE 142' is on a top surface of the ferroelectric insulating layer 132'.

FIG. 17 illustrates the edges of the FeRAM cell 150' extending over an upper surface of the IMD 110C for illustrative purposes. For example, in some embodiments the bottom electrode 122', the ferroelectric insulating layer 132', and the top electrode 142' may extend over the upper surface of the IMD 110C by a distance in a range of about 5 nm to about 15 nm from an edge of the sidewall of IMD 110C. In other embodiments, the bottom electrode 122', the ferroelectric insulating layer 122', and the top electrode 142' may be aligned with the sidewalls of the IMD 110C.

Figure 18:
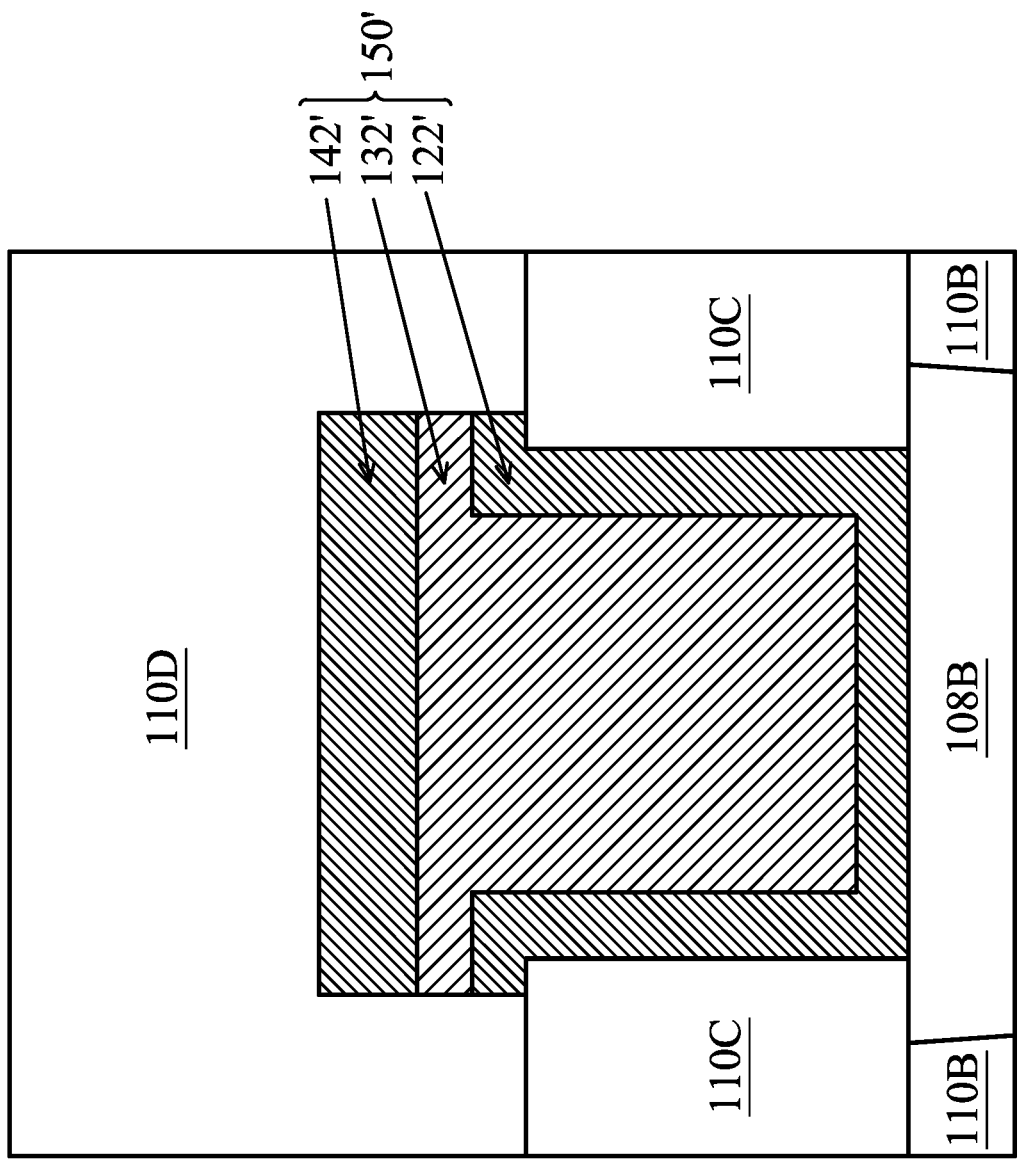

FIG. 18 illustrates an IMD 110D formed over the FeRAM cell 150' and the IMD 110C. The techniques used to deposit the dielectric stack for IMD 110D may be the same as those used in forming the first and second ILD layers 76 and 78, as well as the IMDs 110A, 110B, and 110C.

Figure 19:
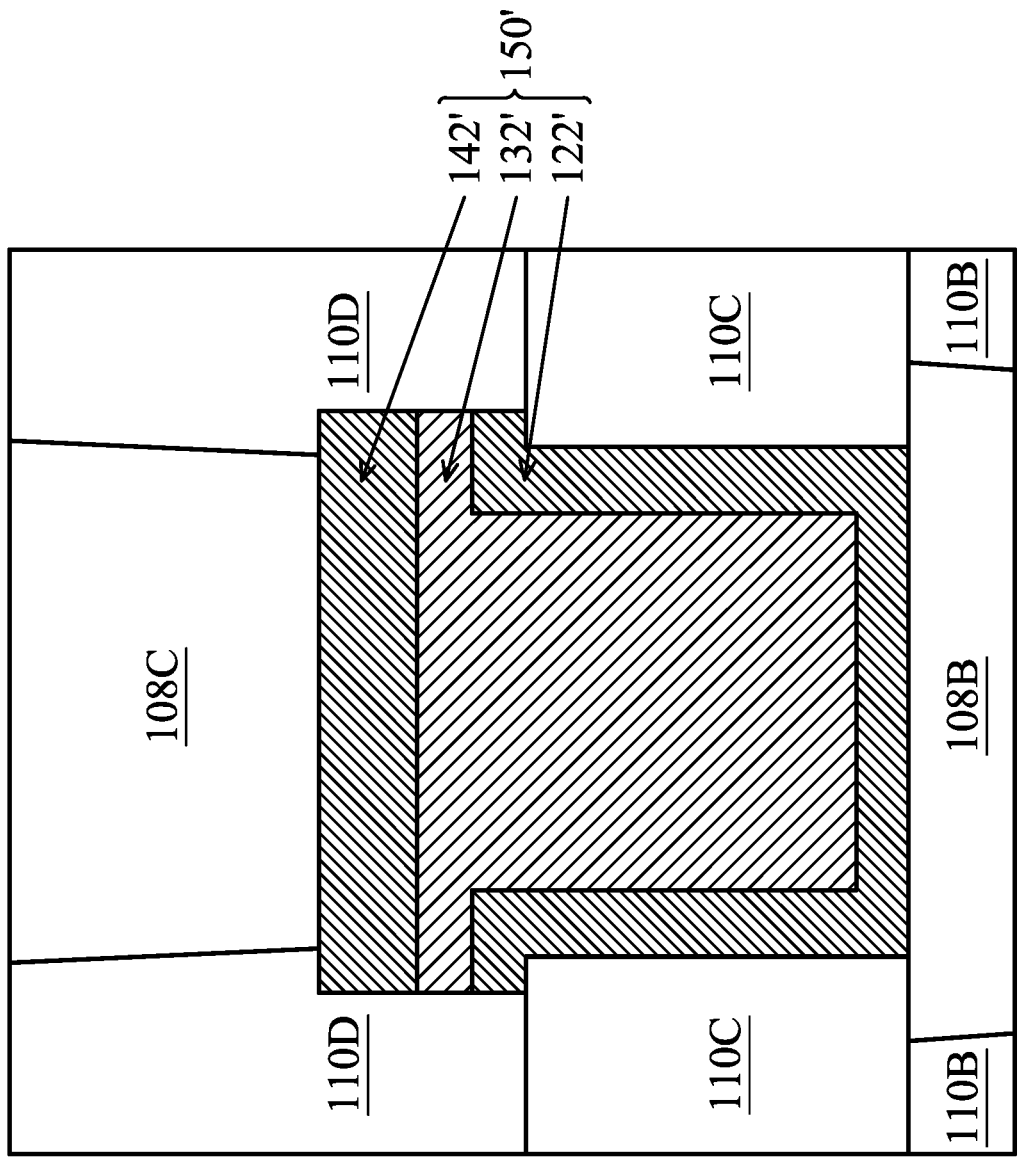

FIG. 19 illustrates a conductive feature 108C formed through the IMD 110D to physically contact the top surface of the FeRAM cell 150'. The techniques used to form the conductive feature 108C may be the same as those used in forming the conductive lines 108A and 108B, as described above with respect to FIG. 1. In some embodiments, the bottom surface of the conductive feature 108C substantially covers the top surface of the FeRAM cell 150'. Because the conductive feature 108C is blocked from physically contacting the BE 122' by an outer portion of the ferroelectric insulating layer 132', the formation of electrical shunting paths from the BE 122' to the conductive feature 108C may be avoided. This may prevent current leakage out of the FeRAM cell 150', allowing the FeRAM cell to hold stored charge better and producing more robust FeRAM cell performance.

Figure 20:
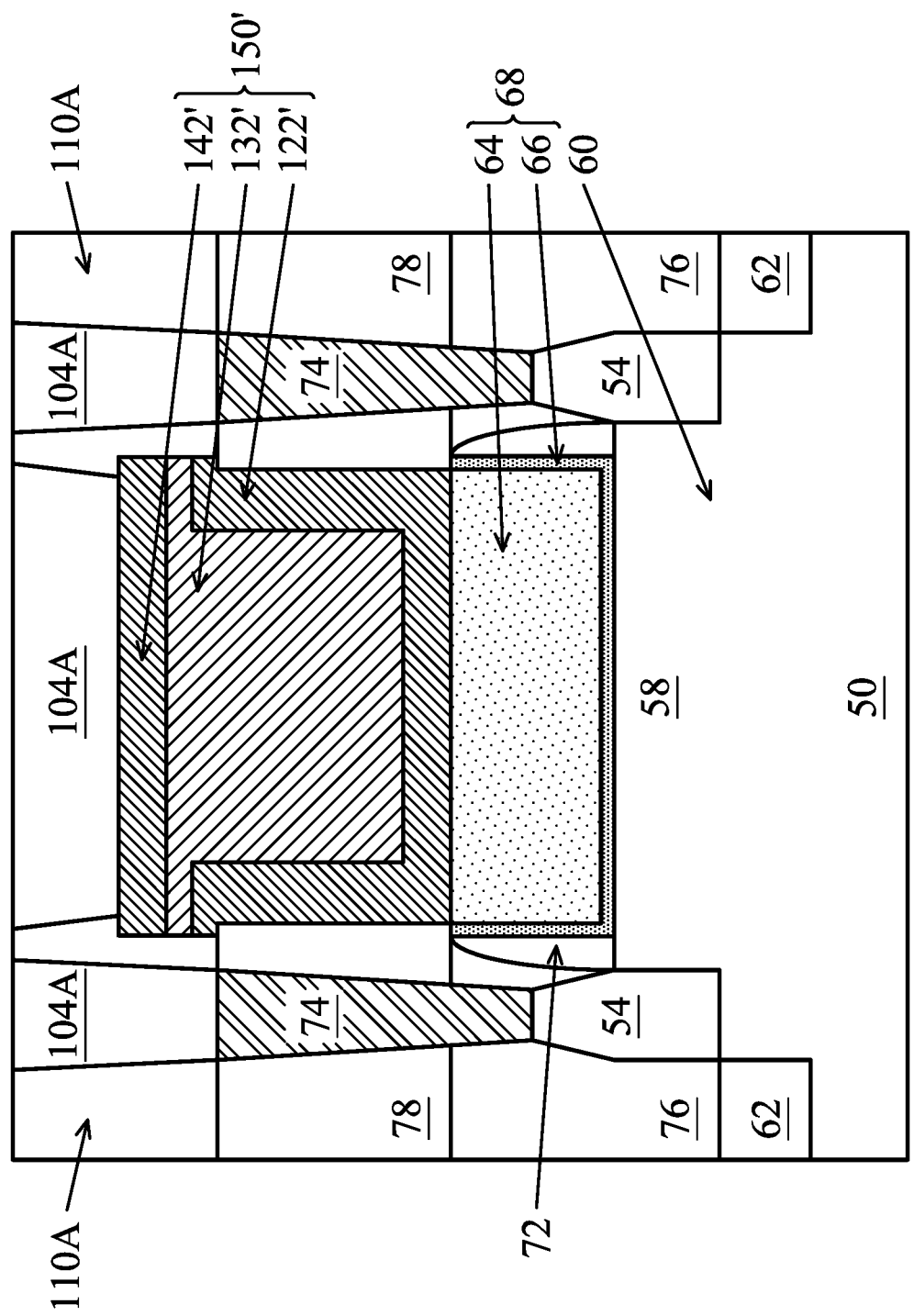

FIG. 20 illustrates an embodiment in which the FeRAM cell 150' is formed directly on the gate electrode 64 in a MEOL process. The method for forming the FeRAM cell 150' on the gate electrode 64 in a MEOL process may be substantially similar as the method for forming the FeRAM cell 150 on the conductive feature 108B in a BEOL process as illustrated above in FIGS. 14A through 19, with the gate electrode 64 substituting for the conductive feature 108B, the second ILD layer 78 substituting for the IMD 110C, the IMD 110A substituting for the IMD 110D, and the conductive via 104A substituting for the conductive feature 108C. Contacts 74 to the source and drain regions 54 may be formed after forming the FeRAM cell 150' and before forming the IMD 110A. Integrating the FeRAM cell 150' in a MEOL scheme such that the FeRAM cell 150' directly contacts the gate electrode 64 is advantageous because increased proximity of the FeRAM cell 150' to the FinFET 60 may provide the benefit of a better RC delay.

Robust FeRAM cell performance may be achieved by reduction or prevention of the formation of shunting paths, which can allow the FeRAM cell to hold its stored charge better. A cross-sectional U-shape via fill process can decrease process cost by reducing the number of fabrication steps in comparison with a flat metal-ferroelectric-metal sandwich structure. Different shapes of ferroelectric insulating capacitor layers and top electrodes are compatible with the U-shaped bottom electrodes. FeRAM cells may be fabricated as part of BEOL schemes in metallization levels located above a transistor such as a FinFET, or the FeRAM cells may be fabricated directly on top of the gate electrode of the transistor as part of MEOL schemes.

In accordance with an embodiment, a semiconductor device includes: a first dielectric layer; a first conductive feature in the first dielectric layer; a second dielectric layer over the first dielectric layer; an ferroelectric random-access memory (FeRAM) cell in the second dielectric layer; a third dielectric layer over the second dielectric layer; and a second conductive feature in the third dielectric layer, the second conductive feature being electrically coupled to the top electrode. The FeRAM cell includes: a bottom electrode contacting the first conductive feature, the bottom electrode extending along an upper surface of the first conductive feature and along sidewalls of the second dielectric layer; a ferroelectric material layer over the bottom electrode, the ferroelectric material layer contacting a sidewall of the second dielectric layer, such that the ferroelectric material layer completely covers an upper surface of the bottom electrode; and a top electrode on the ferroelectric material layer. In an embodiment, the upper surface of the top electrode is level with the upper surface of the ferroelectric material layer. In an embodiment, an upper surface of the ferroelectric material layer physically contacts the second conductive feature. In an embodiment, the top electrode is surrounded by the ferroelectric material layer in a plan view. In an embodiment, the bottom electrode has a thickness in a range of 5 nm to 20 nm. In an embodiment, the ferroelectric material layer has a thickness in a range of 5 nm to 20 nm. In an embodiment, the top electrode has a thickness in a range of 5 nm to 20 nm.

In accordance with another embodiment, a semiconductor device includes: a first dielectric layer; a first conductive feature in the first dielectric layer; a second dielectric layer over the first dielectric layer; an ferroelectric random-access memory (FeRAM) cell in the second dielectric layer; a third dielectric layer over the second dielectric layer; and a second conductive feature in the third dielectric layer, the second conductive feature being electrically coupled to the top electrode. The FeRAM cell includes: a bottom electrode contacting the first conductive feature, the bottom electrode extending along an upper surface of the first conductive feature and along sidewalls of the second dielectric layer; a ferroelectric material layer over the bottom electrode, the ferroelectric material layer protruding above an upper surface of the second dielectric layer, the ferroelectric material layer extending lower than an upper surface of the bottom electrode, such that the ferroelectric material layer completely covers an upper surface of the bottom electrode; and a top electrode on the ferroelectric material layer. In an embodiment, a bottom surface of the top electrode is above an upper surface of the ferroelectric material layer. In an embodiment, a portion of the ferroelectric material layer is surrounded by the bottom electrode in a plan view. In an embodiment, a portion of the ferroelectric material layer is higher than an upper surface of the bottom electrode. In an embodiment, the first conductive feature includes a gate electrode of a FinFET. In an embodiment, the ferroelectric material layer includes hafnium oxide.

In accordance with yet another embodiment, a method of forming a semiconductor device includes: forming a first conductive element in a first dielectric layer; forming a second dielectric layer over the first conductive element; forming an opening through the second dielectric layer to the first conductive element; depositing a first electrode layer over exposed surfaces of the second dielectric layer and the first conductive element; forming a ferroelectric material layer over the first electrode layer, such that a portion of the ferroelectric material layer is lower than an upper surface of the first electrode layer, and such that the ferroelectric material layer covers an upper surface of the first electrode layer; depositing a second electrode layer on the ferroelectric material layer; patterning the first electrode layer, the ferroelectric material layer, and the second electrode layer to form a first electrode, a ferroelectric layer, and a second electrode, respectively; forming a third dielectric layer over the second dielectric layer and the second electrode; and forming a second conductive element in the third dielectric layer, the second conductive element being electrically coupled to the second electrode. In an embodiment, the method further includes: prior to forming the ferroelectric material layer, forming a bottom mask over the first electrode layer, the bottom mask exposing a portion of the first electrode layer along a sidewall of the opening; recessing the first electrode layer below an upper surface of the second dielectric layer; and removing the bottom mask In an embodiment, forming the bottom mask includes using spin coating or CVD processes. In an embodiment, the ferroelectric material layer makes physical contact with the top surface of the second dielectric layer. In an embodiment, the method further includes removing top portions of the ferroelectric material layer and the second electrode, the removing exposing a top surface of the second dielectric layer. In an embodiment, the ferroelectric material layer fills the opening. In an embodiment, the method further includes removing portions of the first electrode, the ferroelectric material layer, and the second electrode over the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first conductive element in a first dielectric layer;
    forming a second dielectric layer over the first conductive element;
    forming an opening through the second dielectric layer to the first conductive element;
    depositing a first electrode layer over exposed surfaces of the second dielectric layer and the first conductive element;
    forming a bottom mask over the first electrode layer, the bottom mask exposing a portion of the first electrode layer along a sidewall of the opening;
    recessing the first electrode layer below an upper surface of the second dielectric layer, a remaining portion of the first electrode layer forming a first electrode;
    removing the bottom mask;
    after removing the bottom mask, forming a ferroelectric material layer over the first electrode, wherein a portion of the ferroelectric material layer is lower than an upper surface of the first electrode, wherein the ferroelectric material layer covers the upper surface of the first electrode;
    depositing a second electrode layer on the ferroelectric material layer;
    patterning the ferroelectric material layer and the second electrode layer to form a ferroelectric layer and a second electrode, respectively;
    forming a third dielectric layer over the second dielectric layer and the second electrode; and
    forming a second conductive element in the third dielectric layer, the second conductive element being electrically coupled to the second electrode.

2. The method of claim 1, wherein forming the bottom mask comprises using spin coating or CVD processes.

3. The method of claim 1, wherein the ferroelectric material layer makes physical contact with an upper surface of the second dielectric layer.

4. The method of claim 1 further comprising removing top portions of the ferroelectric material layer and the second electrode, the removing exposing a top surface of the second dielectric layer.

5. The method of claim 1, wherein the bottom mask comprises a layer of bottom anti-reflective coating (BARC).

6. The method of claim 1, wherein the first electrode comprises a U-shape in a cross-sectional view.

7. The method of claim 1, wherein the ferroelectric material layer comprises hafnium.

8. A method of forming a semiconductor device, the method comprising:
    depositing a first conductive material over a first dielectric layer, the first conductive material covering sidewalls and a bottom surface of a first opening through the first dielectric layer;
    forming a mask over the first conductive material;
    removing a portion of the mask to expose a top portion of the first conductive material;
    removing the top portion of the first conductive material, a top surface of a remaining portion of the first conductive material being below a top surface of the first dielectric layer;
    removing the remaining portion of the mask;
    after removing the remaining portion of the mask, depositing a ferroelectric material layer over the first conductive material and the first dielectric layer;
    forming a second conductive material on the ferroelectric material layer, a bottom surface of the second conductive material being below an uppermost surface of the first conductive material;
    removing a top portion of the second conductive material and the ferroelectric material layer;
    depositing a second dielectric layer over the first dielectric layer, the ferroelectric material layer, and the second conductive material; and
    forming a conductive via through the second dielectric layer, the conductive via contacting the second conductive material.

9. The method of claim 8, wherein the second conductive material is surrounded by the ferroelectric material layer in a plan view.

10. The method of claim 8, wherein the top surface of the remaining portion of the first conductive material is below the top surface of the first dielectric layer by a distance in a range of 5 nm to 20 nm.

11. The method of claim 8, wherein the first conductive material is formed to a thickness less than 5 nm.

12. The method of claim 8, wherein the ferroelectric material layer is formed to a thickness in a range of 5 nm to 20 nm.

13. The method of claim 8, wherein the second conductive material has a thickness in a range of 50 nm to 200 nm after removing the top portion of the second conductive material.

14. The method of claim 8, wherein the first conductive material is deposited in physical contact with a gate structure of a FinFET.

15. A method of forming a semiconductor device, the method comprising:
    forming a first dielectric layer, the first dielectric layer having a recess;
    depositing a first electrode layer along sidewalls and a bottom of the recess;
    forming a ferroelectric material layer over the first electrode layer and the first dielectric layer to fill the recess;
    depositing a second electrode layer on the ferroelectric material layer;
    patterning the second electrode layer, the ferroelectric material layer, and the first electrode layer to form a second electrode, a ferroelectric layer, and a first electrode, respectively, wherein patterning the second electrode layer, the ferroelectric material layer, and the first electrode layer comprises:
        forming a mask on the second electrode layer, the mask having an overhang distance over an upper portion of the ferroelectric material layer past a lower sidewall of the ferroelectric material layer; and
        removing portions of the second electrode layer, the ferroelectric material layer, and the first electrode layer not covered by the mask;
    depositing a second dielectric layer over the second electrode; and
    forming a conductive plug through the second dielectric layer, the conductive plug contacting the second electrode.

16. The method of claim 15 wherein removing portions of the second electrode layer, the ferroelectric material layer, and the first electrode layer comprises a dry etch performed with a plasma comprising $CF^{3*}$, $CF^{2*}$, $CF^*$, $C^*$, and $F^*$ ions.

17. The method of claim 16, wherein the dry etch is performed with a power in a range of 50 W to 500 W.

18. The method of claim 15, wherein the overhang distance is in a range of 5 nm to 15 nm.

19. The method of claim 15, wherein the ferroelectric material layer is formed to a thickness in a range of 5 nm to 20 nm.

20. The method of claim 15, wherein the second electrode layer is formed to a thickness in a range of 50 nm to 200 nm.

* * * * *